United States Patent [19]

Hirano et al.

[11] Patent Number: 5,841,698
[45] Date of Patent: Nov. 24, 1998

[54] SEMICONDUCTOR DEVICE

[75] Inventors: Hiroshige Hirano, Nara; Toshiyuki Honda, Osaka, both of Japan

[73] Assignee: Matsushita Electric Inudustrial Co., Ltd., Osaka, Japan

[21] Appl. No.: 697,511

[22] Filed: Aug. 26, 1996

Related U.S. Application Data

[62] Division of Ser. No. 494,827, Jun. 26, 1995, Pat. No. 5,594,697.

[30] Foreign Application Priority Data

Jun. 28, 1994 [JP] Japan .................................. 6-146267
Jul. 8, 1994 [JP] Japan .................................. 6-157363

[51] Int. Cl.$^6$ .................................................. G11C 16/06
[52] U.S. Cl. .............................. 365/185.21; 365/185.03; 365/189.11; 327/170; 327/437
[58] Field of Search ........................ 365/185.03, 185.21, 365/185.01, 189.11; 327/170, 437

[56] References Cited

U.S. PATENT DOCUMENTS 4,989,184 1/1991 Kishida ..................... 365/208
5,111,432 5/1992 Miyaoka .................. 365/208

*Primary Examiner*—Joseph E. Clawson, Jr.
*Attorney, Agent, or Firm*—McDermott, Will & Emery

[57] ABSTRACT

A semiconductor device includes a nonvolatile memory cell and a current detecting type sense amplifier for detecting a current flowing through a data line into the memory cell. The semiconductor device is further provided with an element for outputting a first voltage detecting signal when a detected supply voltage exceeds a set value and outputting a second voltage detecting signal when the detected supply voltage does not exceed the set value. The sense amplifier includes an element for switching a dependent characteristic of a level sensing current upon the supply voltage to be higher in response to the second voltage detecting signal that in response to the first voltage detecting signal. Thus, error reading of a data from the memory cell, which can be otherwise caused under application of a low supply voltage, can be avoided.

1 Claim, 36 Drawing Sheets

SEMICONDUCTOR DEVICE

This is a divisional of application Ser. No. 08/494,827, filed Jun. 26, 1995 now U.S. Pat. No. 5,594,697.

BACKGROUND OF THE INVENTION

The present invention relates to a semiconductor device including a nonvolatile memory cell and its peripherals, and more particularly, it relates to a flash EEPROM.

Recently, there is increasing demand for a nonvolatile memory that is electrically writable under application of a low voltage. A sense amplifier is one of the important technique of such a low voltage operable nonvolatile memory. A conventional sense amplifier will be herein exemplified.

A circuit diagram for the sense amplifier shown in FIG. 40 will be described first. The sense amplifier receives a control signal SAE and a data line signal DL at its two input terminals, and outputs an output signal OUT through its output terminal.

In this sense amplifier, an inverter INV1 receives the control signal SAE at its input terminal and outputs a signal N1 generated by inverting the control signal SAE. A CMOS inverter including a P-channel MOS transistor Qp1 and an N-channel MOS transistor Qn1 inverts the output signal N1 from the inverter INV1. The output signal N1 from the inverter INV1 is applied to the gates of the transistors Qp1 and Qn1. The source of the P-channel MOS transistor Qp1 is connected to a terminal for supplying a supply voltage VDD, and the source of the N-channel MOS transistor Qn1 is grounded. The drains of the transistors Qp1 and Qn1 are connected to a common signal line, through which a signal N2 generated by inverting the signal N1 is transferred.

P-cannel MOS transistors Qp2 and Qp3 receive the output signal N1 from the inverter INV1 at their gates, and N-channel MOS transistors Qn2 and Qn3 receive the output signal N2 from the CMOS inverter at their gates. The sources of the P-channel MOS transistors Qp2 and Qp3 are respectively connected to terminals for supplying a supply voltage VDD, and the sources of the N-channel MOS transistors Qn2 and Qn3 are connected to a common data line (a signal line L1). The drains of the transistors Qp2 and Qn2 are connected to each other, and the drains of the transistors Qp3 and Qn3 are connected to each other. A signal N3 is output through a signal line connecting the transistor Qp3 to the transistor Qn3.

A P-channel MOS transistor Qp4 receives a ground potential at its gate, an N-channel MOS transistor Qn4 receives the signal is N3 at its gate, and an N-channel MOS transistor Qn5 receives the control signal SAE at its gate. The source of the transistor Qp4 is connected to a terminal for supplying a supply voltage VDD, and the drain thereof is connected to the drain of the transistor Qn4. The source of the transistor Qn4 is connected to the drain of the transistor Qn5, and the source of the transistor Qn5 is grounded. These three transistors Qp4, Qn4 and Qn5 together serve as an output unit. The output signal OUT of the sense amplifier is output through a signal line connecting the drain of the transistor Qp4 to that of the transistor Qn4.

An N-cannel MOS transistor Qn6 is disposed between the gate of the transistor Qn4 and the ground so as to release charge from the gate of the transistor Qn4. An N-cannel MOS transistor Qn8 is disposed between the gate of the transistor Qn2 and the ground, and the gate of the transistor Qn8 is connected to the data line (the signal line L1). An N-channel MOS transistor Qn7 is disposed between the signal line L1 and the ground, and the gate of the transistor Qn7 is supplied with the output signal N1 from the inverter INV1.

The operation of this sense amplifier will now be described.

When the control signal SAE is at a high level and no current flows from the data line (signal line L1) to the ground, the sense amplifier is operated as follows: Since the output signal N1 of the inverter INV1 is at a low level, the transistor Qp1 of the CMOS inverter is turned off and the transistor Qn1 is turned on, resulting in increasing the potential level of the output signal N2 from the CMOS inverter. This turns on the subsequent transistors Qp2, Qp3, Qn2 and Qn3, but the transistor Qn8 starts to be turned on because the potential level of the data line signal DL is high. Because the transistor Qn8 starts to be turned on, the potential level of the signal N2 is decreased and the transistors Qn2 and Qn3 start to be turned off. As a result, the potential level of the signal N3 becomes high. This makes the gate potential of the transistor Qn4 high, thereby allowing the transistor Qn4 to operate. Thus, an output signal OUT is output at a low level.

When the control signal SAE is at a high level and a current flows from the data line signal DL to the ground, the sense amplifier is operated as follows: Since the potential level of the output signal N2 from the CMOS inverter becomes high as in the aforementioned case, the subsequent transistors Qp2, Qp3, Qn2 and Qn3 are all turned on. Nevertheless, the potential of the data line signal DL becomes low because the memory cell connected to the data line (signal line L1) is in an on state, and the transistor Qn8 is kept in an off state. This results in a high potential level of the signal N2 and a low potential level of the signal N3, thereby turning off the transistor Qn4. Thus, an output signal OUT is output at a high level.

When the control signal SAE is at a low level, all the transistors Qp2, Qp3, Qn2 and Qn3 are turned off, resulting in turning off the transistor Qn5. Therefore, the output unit outputs the output signal OUT at a high level. In this case, since both the transistors Qn6 and Qn7 are on, charge is released to the ground from the gates of the transistors Qn4 and Qn8, resulting in keeping low the gate potential of the transistors Qn4 and Qn8.

For attaining a high speed operation, the sizes of the transistors Qp3 and Qn3 are made small so as to minimize the capacitance of the signal N3. Since the transistors Qp3 and Qn3 are disposed previously to the output unit, the load on the transistor Qn4 in the output unit is decreased. Since the transistors Qp2 and Qn2 are disposed previously to the transistors Qp3 and Qn3, the charge is rapidly supplied to the data line. This increases the operation speed of the circuit together with the operation of the transistor Qn8.

FIG. 41 is a characteristic diagram showing the relationship between a supply voltage VDD and a level sensing current in this sense amplifier. The level sensing current herein indicates a current that flows through the data line when the logical voltage of the output signal OUT of the sense amplifier undergoes a transition, i.e., when the transistor Qn4 is turned on/off. As described above, when a current with a level exceeding a predetermined level flows through the data line, the logical voltage of the output signal OUT undergoes a high transition, and when the current with a level exceeding the predetermined level does not flow through the data line, the logical voltage of the output signal OUT undergoes a low transition. In other words, a memory cell having a memory cell on current exceeding a level sensing current is in a low threshold state, and a memory cell having a memory cell on current not exceeding the level sensing current is in a high threshold state. As is shown with a curve VSALC1 in FIG. 41, the level sensing current increases as the supply voltage VDD increases in the conventional sense amplifier. In addition, the increase of the supply voltage VDD also causes the increase of the increasing ratio of the level sensing current.

FIG. 42 is a characteristic diagram showing the relationship between a supply voltage and a data line voltage. As is shown with a characteristic line VDLC1 in FIG. 42, the data line voltage increases as the supply voltage VDD increases.

FIG. 43 is a characteristic diagram showing the relationship among a supply voltage VDD, a level sensing current and a memory cell current. A curve SALV0 shows the variation characteristic of a level sensing current, and a curve MCON0 shows the variation characteristic of a memory cell on current. The memory cell on current herein indicates a characteristic against a supply voltage of a current, which flows between the source and the drain of an FET forming a nonvolatile memory cell when the floating gate is not charged negatively (i.e., in an erasing state) As is shown in FIG. 43, the characteristic curve SALEV0 of the level sensing current has a shape swelling downward similarly to the characteristic curve shown in FIG. 41. The memory cell current generally has a similar characteristic to a current flowing between the source and the drain of a MISFET, and hence, the characteristic curve MCON0 of the memory cell current increases as the supply voltage increases but eventually reaches a saturation state, i.e., has a shape swelling upward.

There exists a memory cell off current (or a memory cell off leak current) in contrast with a memory cell on current. A memory cell off current herein indicates a current that flows through a memory cell when it is not supposed to flow. Such a current is caused in the following two cases: First, when an FET forming a nonvolatile memory cell is negatively charged (i.e., in a writing state), namely, when the threshold value of a memory cell transistor is set to be high, the control gate of the memory cell is selected. In such a case, since the negative charge is insufficient and the threshold value is insufficiently high a current flows through the memory cell. Secondly, although the control gate of the memory cell is not selected, a current flows through the memory cell because the memory cell transistor is of a depletion mode.

In a sense amplifier, the level sensing current is adjusted to have an intermediate value between the memory cell on current and the memory cell off current by adjusting the threshold values of the transistors.

Furthermore, a flash memory stores a data by setting the threshold value of a memory cell transistor within a predetermined range by charging (for a writing operation) or discharging (for an erasing operation) a floating gate. For example, when two kinds of data are desired to be stored using one memory cell, two kinds of threshold values, "H" and "L", suffice. When three kinds of data are desired to be stored using one memory cell, an intermediate threshold value is required to be set as well as "H" and "L". At this point, it is necessary to confirm whether or not the threshold value has been appropriately set, which operation is designated as verification. The verification is performed as follows:

In the verification of a memory cell in a writing state, i.e., having a high threshold value, it is determined whether or not a current flows through the memory cell using the level sensing current, with the word line of the memory cell selected. When it is determined that the level sensing current does not flow and the sense amplifier outputs an output signal OUT at a low level, it is confirmed that the desired high threshold value has been set in the memory cell.

In the verification of a memory cell in an erasing state, i.e., having a low threshold value, it is also determined whether or not a current flows through the memory cell using the level sensing current, with the word line of the memory cell selected. When it is determined that the level sensing current flows and the sense amplifier outputs an output signal OUT at a high level, it is confirmed that the low threshold value has been set in the memory cell. In the verification of the memory cell in an erasing state, however, it is necessary to further confirm that the level sensing current does not flow when the memory cell is not selected. The reason is as follows: An off leak current can flow through an unselected memory cell if the memory cell is of a depletion mode as described above. A plurality of memory cells are connected to one data line, and during the verification of one memory cell in a writing state, an off leak current can flow through another memory cell that is in an erasing state and is not selected. Such an off leak current can decrease the reliability of the verification.

A semiconductor device including the above-mentioned sense amplifier has the following problems:

First, the sense amplifier has a characteristic that, as the supply voltage VDD increases, the level sensing current increases and in addition the increasing ratio of the level sensing current also increases. This results in that the level sensing current is extremely small when the supply voltage is low. In, for example, a flash EEPROM that stores a data by varying the threshold voltage of a memory cell transistor, a slight current can flow through the memory cell transistor even when the threshold voltage thereof is set to be so high that a current is prevented from flowing therethrough. Accordingly, when the level sensing current is small under application of a low supply voltage as described above, it is difficult to distinguish from a current flowing through a memory cell transistor having a low threshold value from a leak current flowing through a memory cell transistor having a high threshold value, in reading a data from the memory cell. This can cause error discrimination of a data stored in the memory cell by the sense amplifier. Furthermore, when the supply voltage VDD is low, the memory cell on current is decreased, and hence, error discrimination can also be caused. There also arises a problem that a longer time is required for the discrimination by the sense amplifier.

Secondly, the data line voltage increases as the supply voltage increases. In, for example, a flash EEPROM that stores a data by varying the threshold voltage of a memory cell transistor, a current is allowed to flow through the memory cell transistor when a voltage is applied to the gate of the memory cell transistor whose threshold voltage is set to be low. In such a case, a high data line voltage can increase the threshold voltage of the memory cell transistor. The increase of the threshold voltage can decrease the current flowing under application of a voltage to the gate of the memory cell transistor. This also can lead to error discrimination by the sense amplifier as in the aforementioned case.

Thirdly, a value of the level sensing current is univocally defined with regard to one supply voltage value. Therefore, it is impossible to determine with margin included whether or not a memory cell current in an on state is larger than a level sensing current value during verification. Accordingly, in, for example, a flash EEPROM that stores a data by varying the threshold voltage of a memory cell transistor, it is impossible to determine whether or not the memory cell current in the on state has sufficient margin even when the threshold voltage is set to be sufficiently low to allow a current to flow. Furthermore, in such a flash EEPROM, there arises another problem that frequent change of the threshold voltage of the memory cell transistor can cause a failure of the flash EEPROM because the memory cell current in the on state decreases as compared with that in the initial state.

Fourthly, since a value of the level sensing current is univocally defined with regard to one supply voltage value, it is impossible to determine with margin included whether or not a memory cell current in an off state is smaller than a level sensing current value. Therefore, in, for example, a flash EEPROM that stores a data by varying the threshold voltage of a memory cell transistor, a slight off current (a leak current) can flow through the memory cell transistor when the memory cell transistor is turned off by grounding the gate thereof. Such an off current increases at a higher temperature, which can disadvantageously causes error discrimination and a failure in the conventional sense amplifier.

SUMMARY OF THE INVENTION

The present invention was devised in order to overcome the aforementioned problems, and has the following objectives:

The first objective is providing a semiconductor device mounting a sense amplifier that can attain a high level sensing current even under application of a low supply voltage.

The second objective is providing a semiconductor device that can attain an appropriate data line voltage even under application of a high supply voltage.

The third objective is providing a semiconductor device that can speed up and stabilize the operation of transistors under application of a low supply voltage and can prevent the degradation of a memory cell under application of a high supply voltage by utilizing the configuration for attaining the second objective.

The fourth objective is providing a semiconductor device that can perform strict verification with sufficiently large margin on a memory cell.

The fifth objective is providing a semiconductor device that can rapidly verify multivalued data by utilizing the configuration for attaining the fourth objective.

In order to attain the first objective, the first semiconductor device of this invention comprises a memory cell; a data line connected to the memory cell; voltage supplying means for supplying a supply voltage; supply voltage detecting means connected to the voltage supplying means, for detecting at least two supply voltage regions separated by at least one set value and outputting a plurality of kinds of voltage detecting signals corresponding to the respective supply voltage regions; control signal input means for entering a first control signal for giving an instruction to read a data from the memory cell; current detecting means connected to the control signal input means, the voltage supplying means and the data line, for detecting, in response to the first control signal, a current flowing from the voltage supplying means to the data line by using a level sensing current in accordance with the supply voltage, the current detecting means having a plurality of different dependent characteristics as a dependent characteristic of the level sensing current upon the supply voltage; and dependent characteristic switching means connected to the supply voltage detecting means and the current detecting means, for switching the dependent characteristic of the level sensing current to be two of the different dependent characteristics in accordance with the kind of a voltage detecting signal output by the supply voltage detecting means.

Owing to this configuration, it is possible to switch the dependent characteristic of the level sensing current of the current detecting means upon the supply voltage in accordance with the kind of the voltage detecting signals corresponding to the respective supply voltage regions. Accordingly, error discrimination due to the variation of the supply voltage can be prevented in reading a data from the memory cell in the semiconductor device.

In one aspect, when the current detecting means receives a voltage detecting signal corresponding to a lower supply voltage region from the supply voltage detecting means, a dependent characteristic with a higher level sensing current is selected than a level sensing current selected when a voltage detecting signal corresponding to a higher supply voltage region is received.

Owing to this configuration, the level sensing current of the current detecting means is higher in the lower supply voltage region, and hence, the semiconductor device is stably operated even when a larger leak current is present in the memory cell, and error discrimination is effectively prevented.

Furthermore, the supply voltage detecting means can allow the voltage detecting signal to have a hysteresis characteristic. In this case, the semiconductor device can be stably operated even when a voltage with a value approximate to a set value is used as the supply voltage.

Preferably, the supply voltage detecting means changes the kind of a voltage detecting signal to be output when the current detecting means is not operated.

In order to attain the second objective, the second semiconductor device of this invention comprises a memory cell; a data line connected to the memory cell; voltage supplying means for supplying a supply voltage; supply voltage detecting means connected to the voltage supplying means, for outputting a first voltage detecting signal when the supply voltage exceeds a set value and outputting a second voltage detecting signal when the supply voltage does not exceed the set value; control signal input means for entering a first control signal for giving an instruction to read a data from the memory cell; current detecting means connected to the control signal input means, the voltage supplying means and the data line, for detecting a current flowing from the voltage supplying means to the data line in response to the first control signal; and dependent characteristic switching means connected to the supply voltage detecting means and the current detecting means, for switching a dependent characteristic upon the supply voltage of a data line exhibited when the current flows, between a first dependent characteristic and a second dependent characteristic different from each other.

In order to attain the third objective, the third semiconductor device of this invention comprises a memory cell; a signal line connected to the memory cell; voltage supplying means for supplying a supply voltage to the signal line; supply voltage detecting means connected to the voltage supply means, for outputting a first voltage detecting signal when the supply voltage exceeds a set value and outputting a second voltage detecting signal when the supply voltage does not exceed the set value; and boosting means connected to the supply voltage detecting means and the signal line, for boosting a potential of the signal line to be higher than the supply voltage in response to the second voltage detecting signal. The signa line is a word line or a data line.

Owing to the configuration of the third semiconductor device, the potential of the word line or the data line connected to the memory cell is boosted to be higher than the supply voltage in the lower supply voltage region, and therefore, the operation of the transistors in the semiconductor device is speeded up and stabilized. In a higher supply voltage region, the degradation of the memory cell transistor otherwise caused by application of an excessive voltage can be prevented.

In order to attain the fourth objective, the fourth semiconductor device of this invention comprises a memory cell; a data line connected to the memory cell; voltage supplying means for supplying a supply voltage; first control signal input means for entering a first control signal for giving an instruction to generally read a data from the memory cell; second control signal input means for entering a second control signal for giving an instruction to discriminate a current value of a current flowing through the memory cell; current detecting means connected to the first and second control signal input means, the voltage supplying means and the data line, for detecting a current flowing from the voltage supplying means to the data line by using a level sensing current according to the supply voltage in response to the first and second control signals; and level switching means connected to the second control signal input means, for switching the level sensing current so that a difference in a current value between the current detected by the current detecting means and the current flowing through the memory cell in the discrimination under instruction of the second control signal is smaller than a difference therebetween in a general reading operation.

Owing to the configuration of the fourth semiconductor device, it is possible to perform strict discrimination with sufficient margin included when it is confirmed whether or not an on state or an off state of the memory cell is appropriately set. Therefore, reliability of the semiconductor device is further improved.

In one aspect of the fourth semiconductor device, the current detecting means has a plurality of different dependent characteristics as a dependent characteristic of the level sensing current upon the supply voltage. The level switching means is connected to the first and second control signal input means and the current detecting means, and switches the dependent characteristic of the level sensing current of the current detecting means upon the supply voltage between two different dependent characteristics selected among the plurality of dependent characteristics, so that a dependent characteristic in is response to the first control signal is different from that in response to the second control signal.

When the second control signal instructs to discriminate a current value in the memory cell in an on state, the level switching means switches the dependent characteristic of the level sensing current of the current detecting means upon the supply voltage, so that a level sensing current in response to the second control signal is higher than that in response to the first control signal.

Owing to this configuration, a difference in the current value between the memory cell current and the current detected by the current detecting means is smaller in discriminating the memory cell current in an on state than in a reading operation. Therefore, the discrimination of the memory cell can secure sufficient margin.

When the second control signal instructs to discriminate a current value in the memory cell in an on state, the level switching means switches the dependent characteristic of the level sensing current of the current detecting means upon the supply voltage under the instruction of the second control signal, so that a dependent characteristic having a highest level sensing current is selected among the plurality of dependent characteristics.

Owing to this configuration, by discriminating the current value in a memory cell under strict conditions previously in the initial stage, margin can be secured for degradation of the characteristic of the memory cell that can be caused with time.

When the second control signal successively gives a plurality of instruction to discriminate a current value in the memory cell in an on state, the level switching means switches the dependent characteristic of the level sensing current of the current detecting means upon the supply voltage under instruction of the second control signal, so that the dependent characteristic is changed to have a higher level sensing current under a latter instruction.

Owing to this configuration, since the current value in the memory cell is discriminated successively under a more strict condition, it is possible to identify a memory cell to be recovered in accordance with the capacity of a redundancy memory cell and to maximize the minimum value of the margin in the memory cell.

When the second control signal instructs to discriminate a current value in the memory cell in an on state, the level switching means controls a current flowing through the memory cell so that a current in response to the second control signal is smaller than in response to the first control signal.

In this case, the semiconductor device further comprises a word line connected to the memory cell and word line voltage supplying means for supplying a voltage to the word line that is able to switch the voltage to be supplied to the word line among a plurality of voltage values. The level switching means lowers a potential of the word line in response to the second control signal as compared with that in response to the first control signal.

Owing to this configuration, since the potential of the word line is set to be lower in the discrimination of the current value in the memory cell in an on state than in the reading operation, a difference in the current value between the current detected by the current detecting means and the memory cell current in the discrimination of the memory cell in an on state is smaller than a difference therebetween in the reading operation. Therefore, sufficient margin is secured in the discrimination of the memory cell.

In the fourth semiconductor device, when the second control signal instructs to discriminate a current value in the memory cell in an off state, the level switching means switches the dependent characteristic of the level sensing current of the current detecting means upon the supply voltage, so that a level sensing current in response to the second control signal is lower than that in response to the first control signal.

Owing to this configuration, a difference in the current value between the memory cell current in the discrimination of the memory cell in an off state and the current detected by the detecting means is smaller than a difference therebetween in the reading operation. Therefore, sufficient margin can be secured in the discrimination of the memory cell.

When the second control signal instructs to discriminate a current value in the memory cell in an off state, the level switching means controls a current flowing through the memory cell to be higher in response to the second control signal than in response to the first control signal.

In this case, the semiconductor device further comprises data line voltage supplying means for supplying a voltage to the data line. The level switching means controls the data line voltage supplying means so that a data line voltage supplied by the data line voltage supplying means is higher in response to the second control signal than in response to the first control signal.

Owing to this configuration, a difference in the current value between the memory cell current in the discrimination of the memory cell in an off state and the current detected by the detecting means is smaller than a difference therebetween in the reading operation. Therefore, sufficient margin can be secured for the discrimination of the memory cell.

In still another aspect, the semiconductor device further comprises a word line connected to the memory cell and word line voltage supplying means for supplying a voltage to the word line that is able to switch the voltage to be supplied to the word line among a plurality of voltage values. The level switching means controls the word line voltage supplying means so that a potential of the word line is lower in response to the first control signal than in response to the second control signal.

In order to attain the fifth objective, the fifth semiconductor device of this invention similar to the fourth semiconductor device except that the second control signal instructs to read and discriminate a plurality of data. In this case, the level switching means instructs to successively select the plurality of level sensing currents of the current detecting means in response to the second control signal. By discriminating the current value of the current flowing through the memory cell by using the successively selected level sensing currents, a plurality of data values are discriminated with the current value in one memory cell.

Owing to this configuration, it is possible to read multivalued data merely by switching the level sensing current of the current detecting means without providing an exclusive reference cell.

In another aspect, the semiconductor device comprises a memory cell; a data line connected to the memory cell; a first group of a plurality of transistors whose sources are connected to the data line and which include at least a first and second transistors; and a second group of a plurality of transistors each of which is supplied with a first signal at its gate and which are disposed between a power supply and the drains of the first group of the transistors and include at least a third and fourth transistor. The fist transistor has a different current ability or a different threshold value from that of the second transistor, and a plurality of data values are discriminated with a current value in one memory cell by using a signal from the drain of the first transistor and a signal from the drain of the second transistor.

Owing to this configuration, it is possible to read multivalued data merely switching the level sensing current of the current detecting means without providing an exclusive reference cell. Furthermore, since two or more data can be defined in one step, extremely high speed data reading can be realized.

DETAILED DESCRIPTION OF THE INVENTION

The present invention will now be described by way of examples.

(Embodiment 1)

Figure 1:
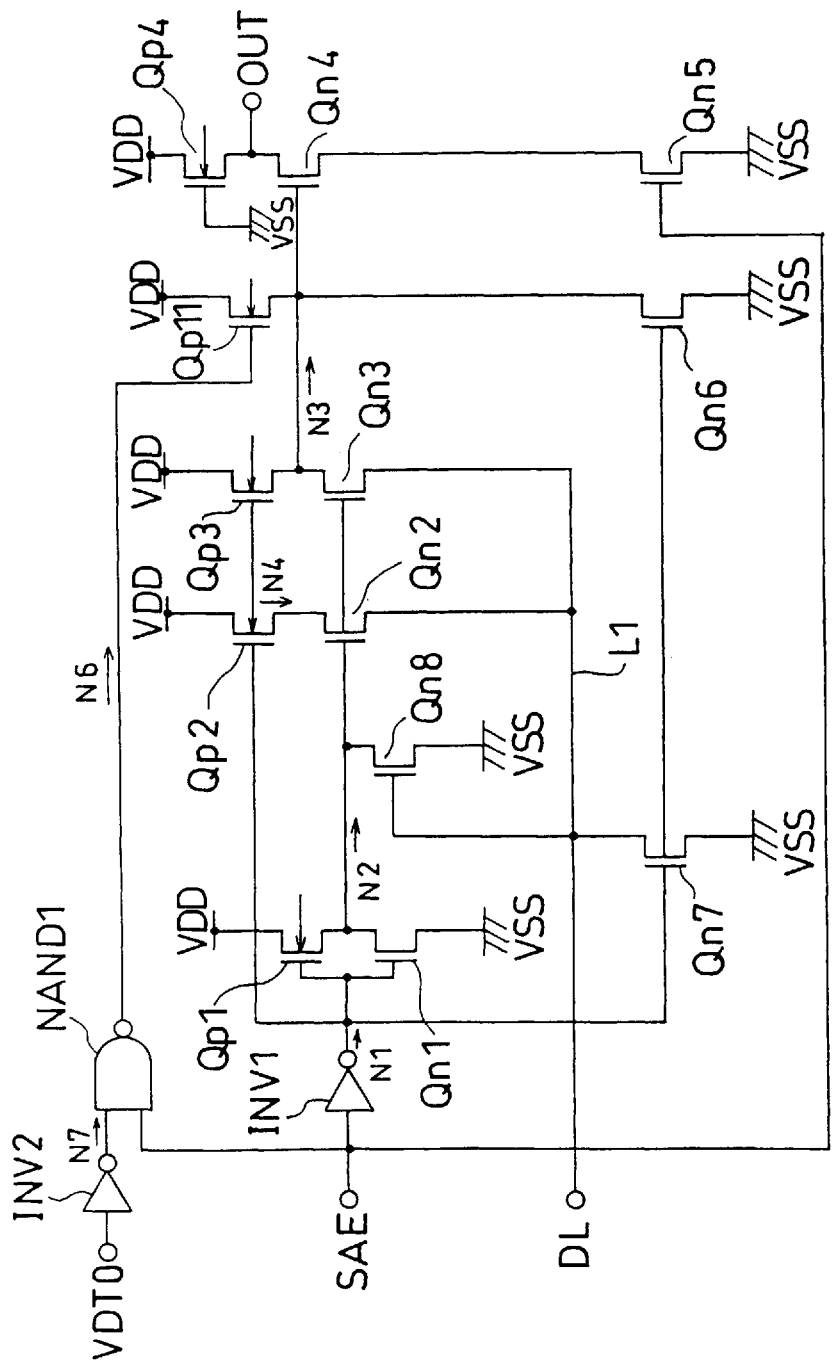
FIG. 1 is an electric circuit diagram of a sense amplifier according to Embodiment 1.
Figure 2:
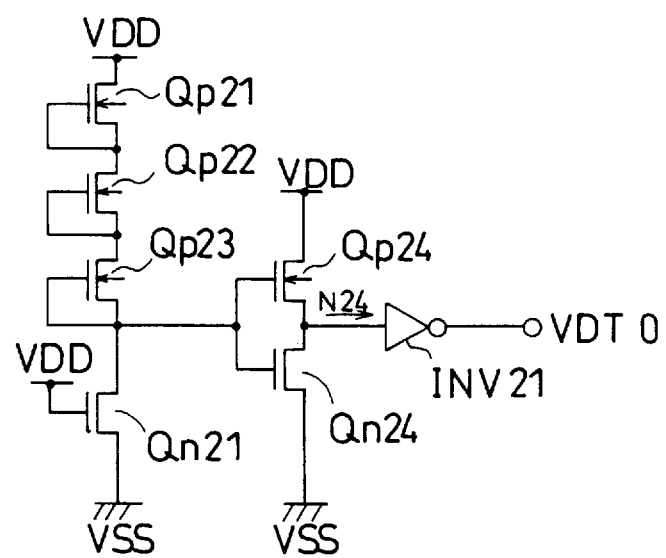
FIG. 2 is an electric circuit diagram of a voltage detector of Embodiment 1.

The configuration of a semiconductor device of Embodiment 1 will be first described referring to FIGS. 1 and 2, which are electric circuit diagrams showing the configurations of a sense amplifier and a voltage detector of this embodiment, respectively.

Figure 40:
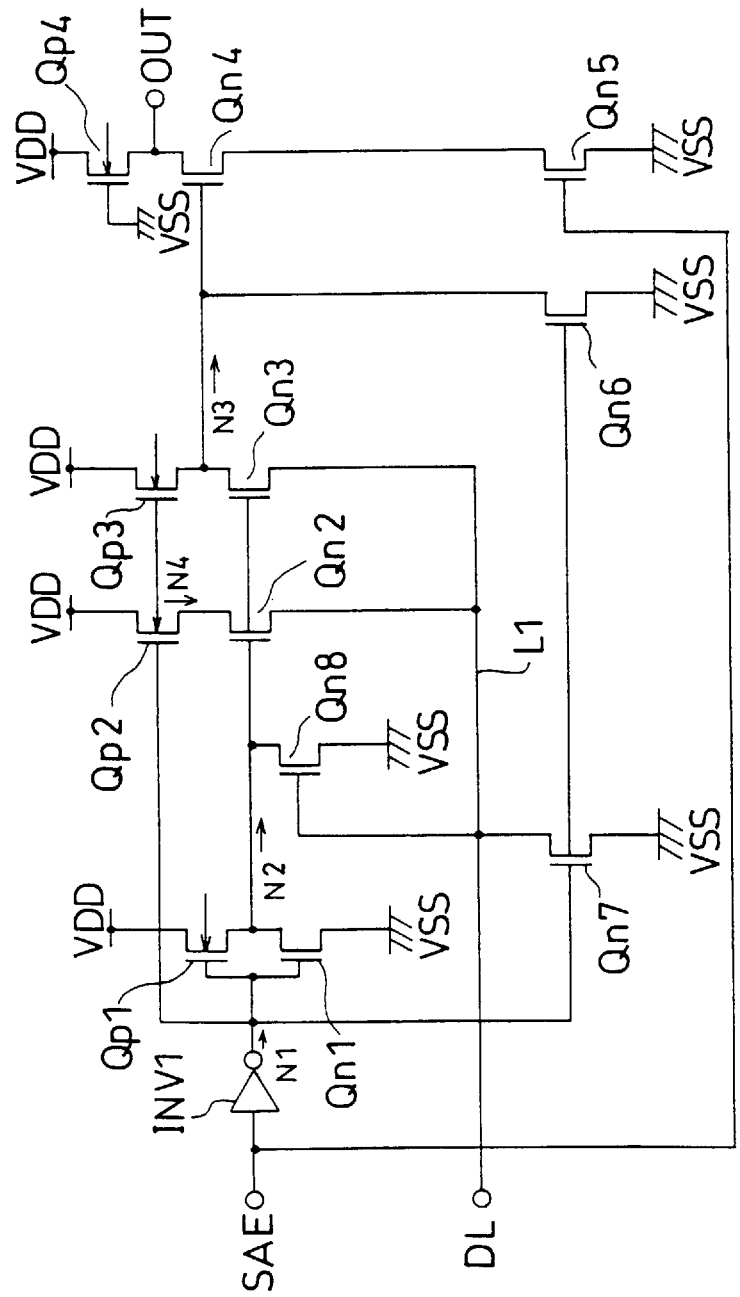
FIG. 40 is an electric circuit diagram of a conventional sense amplifier.
Figure 41:
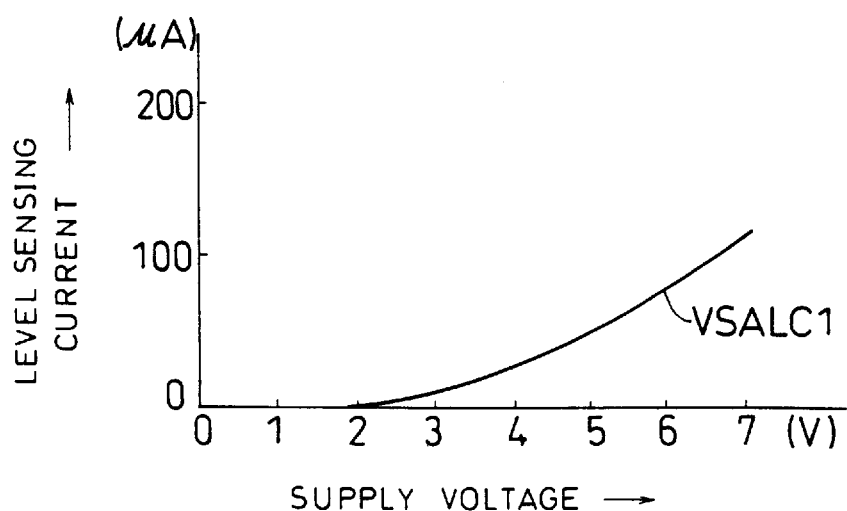
FIG. 41 is a characteristic diagram showing the relationship between a level sensing current and a supply voltage in the conventional sense amplifier.
Figure 42:
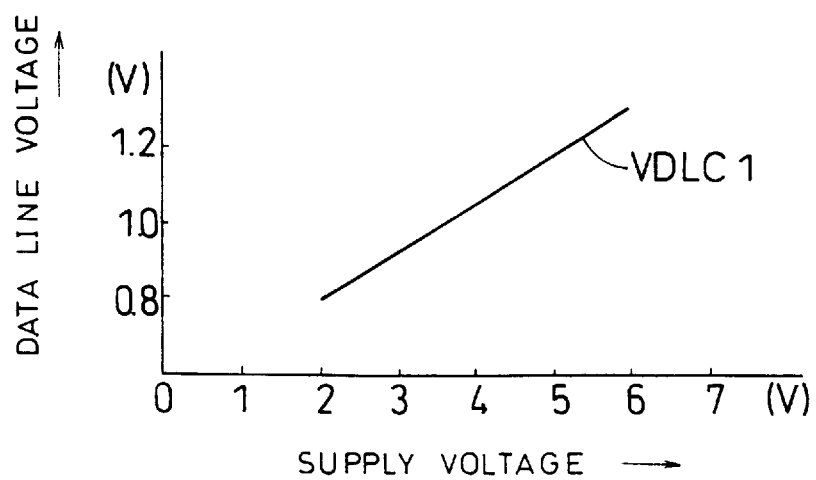
FIG. 42 is a characteristic diagram showing the relationship between a data line voltage and a supply voltage in the conventional sense amplifier.
Figure 43:
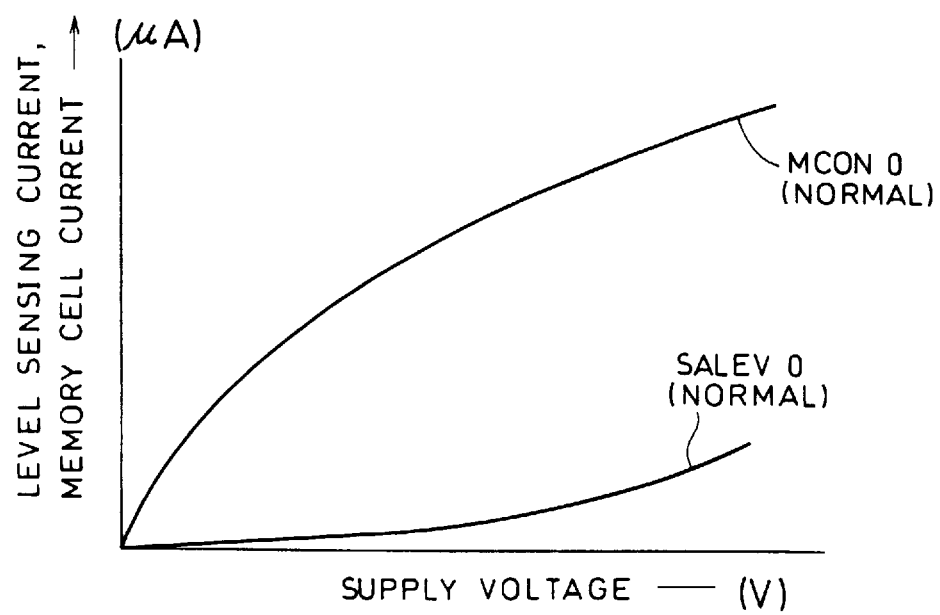
FIG. 43 is a characteristic diagram showing the relationship among a level sensing current, a memory cell current and a supply voltage in the conventional sense amplifier.

The configuration of the sense amplifier of FIG. 1 is fundamentally identical to that of the conventional sense amplifier shown in FIG. 40. This sense amplifier receives a control signal SAE and a data line signal DL at its input terminals and outputs an output signal OUT through its output terminal. As does the conventional sense amplifier of FIG. 40, this sense amplifier comprises an inverter INV1, two transistors Qp1 and Qn1 together working as a CMOS inverter, two transistors Qp2 and Qn2 for attaining a rapid operation of the circuit, two transistors Qp3 and Qn3 for decreasing the load on an output unit, three transistors Qp4, Qn4 and Qn5 together working as the output unit, and transistors Qn6, Qn7 and Qn8 operated for releasing charge from each signal line to the ground. These elements are disposed and operated in the same manner as described above referring to FIG. 40, and hence the description is omitted.

This sense amplifier further comprises, as one of the characteristics of this embodiment, an element for varying the characteristic of a level sensing current by using a voltage detecting signal. Specifically, the sense amplifier further comprises an inverter INV2 that receives a voltage detecting signal VDT0 and outputting a signal N7 generated by inverting the voltage detecting signal VDT0, a NAND circuit NAND1 that receives an output signal N7 of the inverter INV2 and the control signal SAE and outputs a signal N6 generated through the NAND operation of these signals, and a P-channel MOS transistor Qp11 that receives an output signal N6 of the NAND circuit NAND1 at its gate. The drain of the P-channel MOS transistor Qp11 is connected to a terminal for supplying a supply voltage VDD, and the source thereof is connected to a signal line leading to the gate of the transistor Qn4 in the output unit. Owing to this configuration, the transistor Qp11 is operated in accordance with the voltage detecting signal VDT0, thereby increasing the potential level of the signal N3.

FIG. 2 is a circuit diagram of the voltage detector for generating the voltage detecting signal VDT0 to be input to the sense amplifier. As is shown in FIG. 2, between a terminal for supplying a supply voltage VDD and the ground are disposed three P-channel MOS transistors, Qp21, Qp29 and Qp23 and an N-channel MOS transistor Qn21 connected in series. The gates of the transistors Qp21, Qp22 and Qp23 are connected to their own drains, respectively, and the gate of the transistor Qn21 is connected to a terminal for supplying a supply voltage VDD. The drains of the transistors Qp23 and Qn21 are connected to a common signal line, through which a signal N23 is transferred. The voltage detector further comprises a CMOS inverter including a P-channel MOS transistor Qp24 and an N-channel MOS transistor Qn24 that receive the signal N23 at their gates. The source of the transistor Qp24 in the CMOS inverter is connected to a terminal for supplying a supply voltage VDD, and the source of the N-channel MOS transistor Qn24 is grounded. The CMOS inverter outputs a signal N24 generated by inverting the signal N23 input to the gates of the transistors Qp24 and Qn24. An inverter INV21 disposed subsequently to the CMOS inverter generates the voltage detecting signal VDT0 by inverting the signal N24. This voltage detector switches the level of the voltage detecting signal VDT0, by adjusting the threshold values of the respective transistors, between the cases where the supply voltage VDD is below and exceeds a set value of 4 V.

Figure 3:
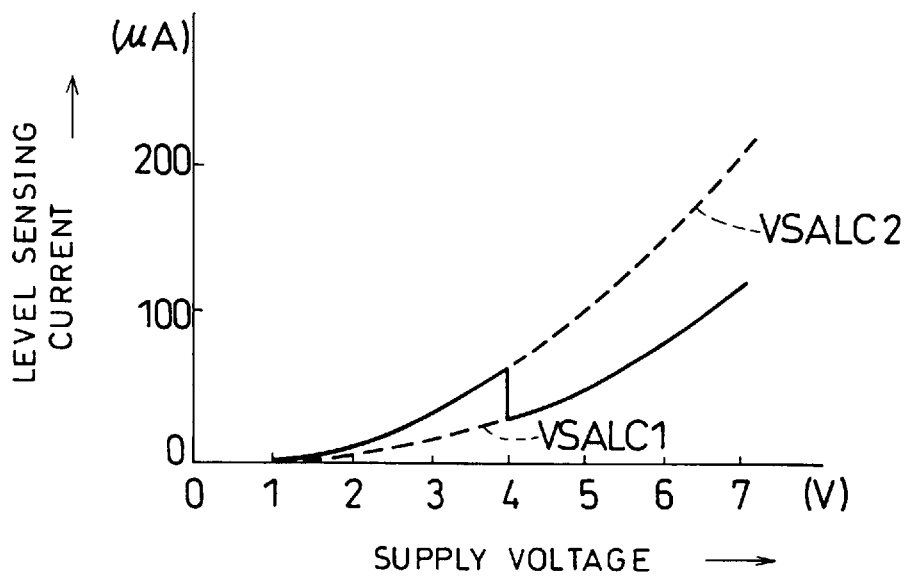
FIG. 3 is a characteristic diagram showing the relationship between a level sensing current and a supply voltage in the sense amplifier of Embodiment 1.
Figure 4:
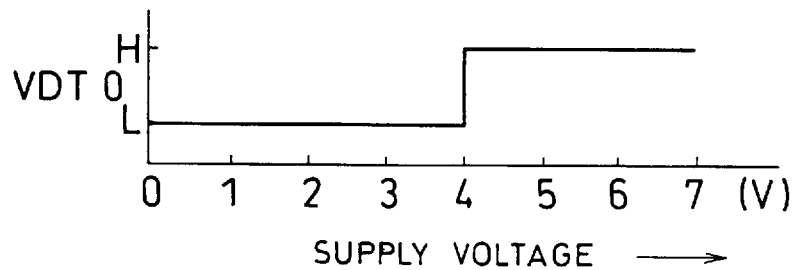
FIG. 4 is a characteristic diagram showing the relationship between an output signal and a supply voltage in the voltage detector of Embodiment 1.

Referring to FIGS. 3 and 4, the operation of the sense amplifier of this embodiment will be described. FIG. 3 is a characteristic diagram showing the relationship between a level sensing current and a supply voltage VDD in the sense amplifier. FIG. 4 is a characteristic diagram showing the relationship between the output signal VDT0 of the voltage detector and the supply voltage VDD. As is shown in FIG. 4, when the supply voltage VDD is below 4 V, the logical value of the output signal VDT0 of the voltage detector is "L". When the supply voltage VDD exceeds 4 V, the logical value of the output signal VDT0 is switched to be "H".

The level sensing current is discontinuously varied in accordance with whether the logical value of the voltage detecting signal VDT0 is "H" or "L". Specifically, when the logical value of the voltage detecting signal VDT0 is "H" in this sense amplifier, the logical value of the signal N6 is "H"

and the transistor Qp11 is not operated. In such a case, this sense amplifier has an output characteristic similar to that of the conventional sense amplifier of FIG. 40, which is indicated as a curve VSALC1 in FIG. 3.

When the logical value of the control signal SAE is "H" and the logical value of the voltage detecting signal VDT0 is "L", the logical value of the signal N6 is "L" and the transistor Qn11 is operated, thereby increasing the potential level of the signal N3. Through this operation, the characteristic of the sense amplifier is switched to be that shown as a curve VSALC2 in FIG. 3, which is obtained by moving the curve VSALC1 upward. Specifically, when the supply voltage VDD is as low as 4 V or less (i.e., in a low voltage region), the level sensing current exhibits the characteristic according to the curve VSALC2, and when the supply voltage VDD is as high as to exceed 4 V (i .e., in a high voltage region), the level sensing current exhibits the characteristic according to the curve VSALC1.

Accordingly, the sense amplifier of this embodiment can effectively prevent error data discrimination even when a memory cell transistor has a slight leak current because the level sensing current is sufficiently large even when the supply voltage is low.

(Embodiment 2)

Now, Embodiment 2 will be described referring to FIGS. 5 through 7.

The configuration of a sense amplifier of this embodiment is identical to that of Embodiment 1 shown in FIG. 1, and the configuration of a voltage detector is different from that of Embodiment 1 shown in FIG. 2.

Figure 5:
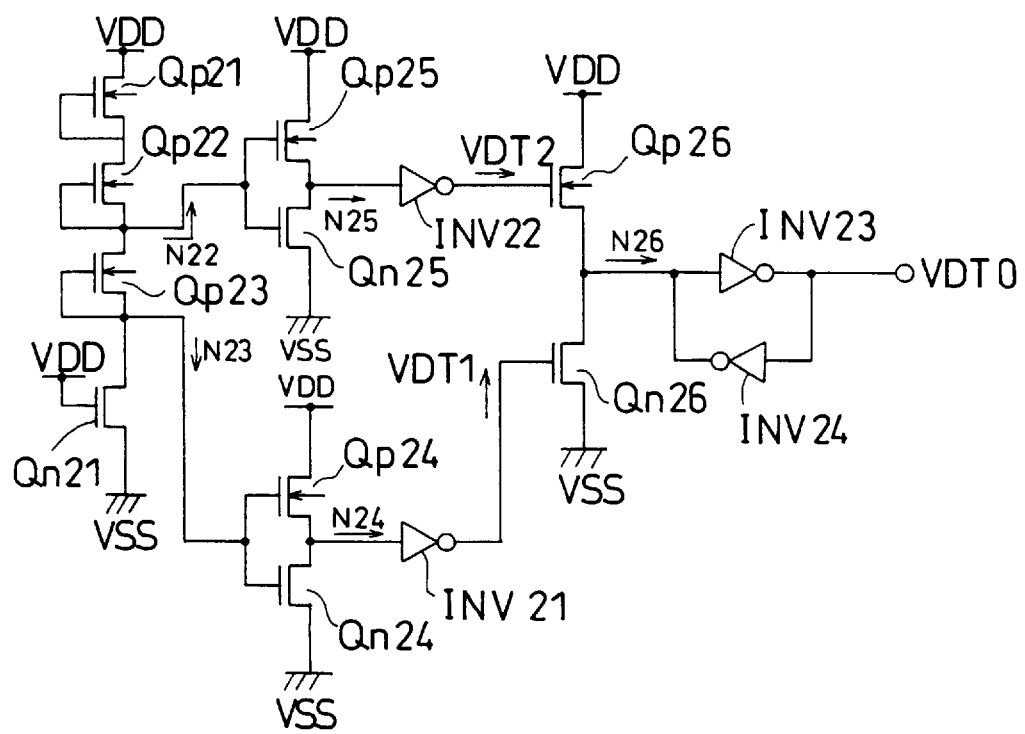
FIG. 5 is an electric circuit diagram of a voltage detector of Embodiment 2.

FIG. 5 is a circuit diagram of the voltage detector for the semiconductor device of this embodiment. This voltage detector is similar to that of Embodiment 1 shown in FIG. 2 in comprising three P-channel MOS transistors Qp21 through Qp23, an N-channel MOS transistor Qn21, a CMOS inverter including a P-channel MOS transistor Qp24 and an N-channel MOS transistor Qn24 and an inverter INV21. The voltage detector further comprises a signal line connecting the drain of the transistor Qp22 to the source of the transistor Qp23, and a CMOS inverter including a P-channel MOS transistor Qp25 and an N-channel MOS transistor Qn25 that receive a signal N22 transferred through the signal line at their gates. The voltage detector further comprises an inverter INV22 that receives an output signal N25 of the CMOS inverter and outputs a signal VDT2 generated by inverting the output signal N25. The voltage detector is additionally provided with an N-channel MOS transistor Qn26 and a P-channel MOS transistor Qp26 that receive the output signals VDT1 and VDT2 of the inverters INV21 and INV22 at their gates, respectively. The source of the transistor Qp26 is connected to a supply voltage VDD, the source of the transistor Qn26 is grounded, and a signal N26 is output through a signal line commonly connected to the drain of the transistor Qp26 and that of the transistor Qn26. Furthermore, the voltage detector is provided with an inverter INV23 that receives the signal N26 and outputs an output signal VDT0 generated by inverting the signal N26, and an inverter INV24 that inverts the output signal VDT0 of the inverter INV23 again and transfers the resultant signal to the input port of the inverter INV23. It is noted that, through the adjustment of the threshold values of the respective transistors, the output signal VDT1 of the inverter INV21 is at a low level when the supply voltage VDD is 3.5 V or less, and is at a high level when the supply voltage VDD exceeds 3.5 V, as is shown in FIG. 7 described in detail below. It is also noted that, through the adjustment of the threshold values of the respective transistors, the output voltage VDT2 of the inverter INV22 is at a low level when the supply voltage VDD is 4.5 V or less, and is at a high level when it exceeds 4.5 V.

The voltage detector is functionally characterized by that it outputs the voltage detecting signal VDT0 having a hysteresis characteristic against the supply voltage by using the two voltage detecting signals VDT1 and VDT2. FIG. 6 is a characteristic diagram showing the relationship between the supply voltage and the level sensing current obtained when the voltage detecting signal VDT0 output by the voltage detector of FIG. 5 is supplied to the sense amplifier of FIG. 1, and FIG. 7 is a characteristic diagram showing the relationship between the supply voltage for the voltage detector and the voltage detecting signal.

Figure 7:
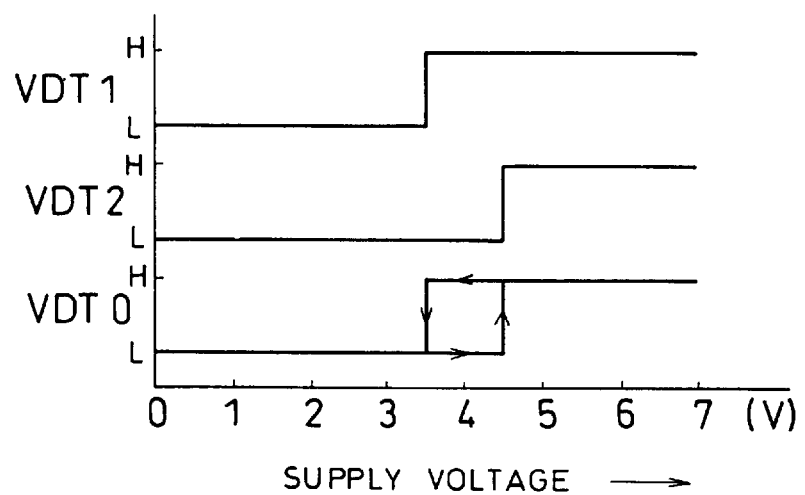
FIG. 7 is a characteristic diagram showing the relationship between an output signal and a supply voltage in the voltage detector of Embodiment 2.

As is shown in FIG. 7, the voltage detecting signal VDT0 ultimately output by the voltage detector has the following logical voltages:

(1) When VDD≦3.5 V, the voltage detecting signal VDT0 is at a low level:

(2) When VDD>4.5 V, the voltage detecting signal VDT0 is at a high level; and (3) When 3.5 V<VDD≦4.5 V,
   (A) in the case where the supply voltage VDD has been increased from a voltage below 3.5 V, the voltage detecting signal VDT0 is at a low level, and
   (B) in the case where the supply voltage VDD has been a decreased from a voltage exceeding 4.5 V, the voltage detecting signal is at a high level.

Figure 6:
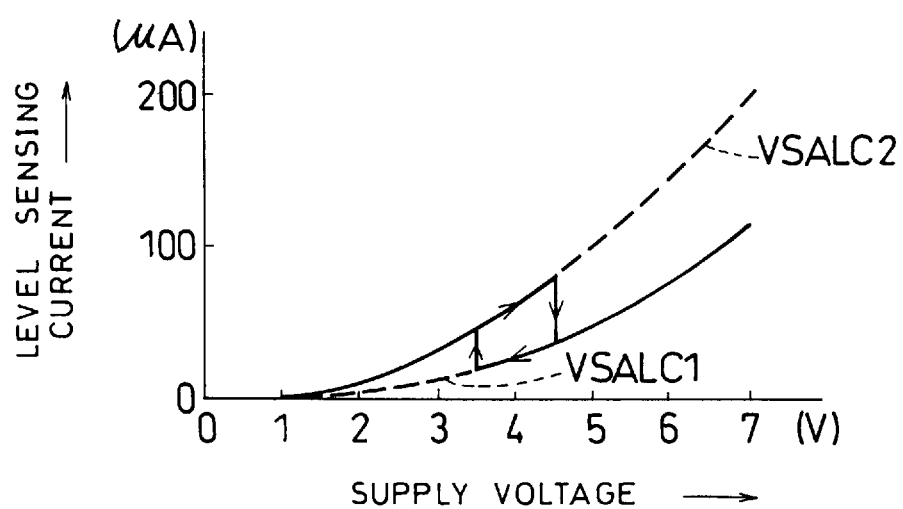
FIG. 6 is a characteristic diagram showing the relationship between a level sensing current and a supply voltage in a sense amplifier of Embodiment 2.

The characteristic of the level sensing current is discontinuously varied as is shown in FIG. 6 in accordance with the aforementioned operation of the voltage detecting signal VDT0. Specifically, the level sensing current curve is switched between the curves VSALC1 and VSALC2 in accordance with the change of the supply voltage as follows:

(1) When VDD≦3.5 V, the level sensing current curve VSALC2 is exhibited;

(2) When VDD>4.5 V, the level sensing current curve VSALC1 is exhibited; and (3) When 3.5<VDD≦4.5,
   (A) in the case where the supply voltage VDD has been increased from a voltage below 3.5 V, the level sensing current curve VSALC2 is exhibited, and
   (B) in the case where the supply voltage VDD has been decreased from a voltage exceeding 4.5 V, the level sensing current curve VSALC1 is exhibited.

In this manner, similarly to the sense amplifier of Embodiment 1, the sense amplifier of Embodiment 2 including such a voltage detector can discriminate a data without an error even when a memory cell transistor has a slight leak current since the level sensing current is not decreased as low as that in the conventional sense amplifier even under application of a low voltage. In addition, the voltage at which the level sensing current curves are switched is allowed to have a hysteresis characteristic against the supply voltage VDD. Therefore, when two types of devices respectively adopting a supply voltage of, for example, 3 V and 5 V are provided by using this semiconductor device, the 3 V device has a fixed level sensing current curve of VSALC2 at a supply voltage of 4.5 V or less, and the 5 V device has a fixed level sensing current curve of VSALC1 at a supply voltage of 3.5 V or less. As a result, the resultant devices can be stably operated even when the supply voltages are somewhat varied.

(Embodiment 3)

Now, Embodiment 3 will be described referring to FIGS. 8 and 9.

Figure 8:
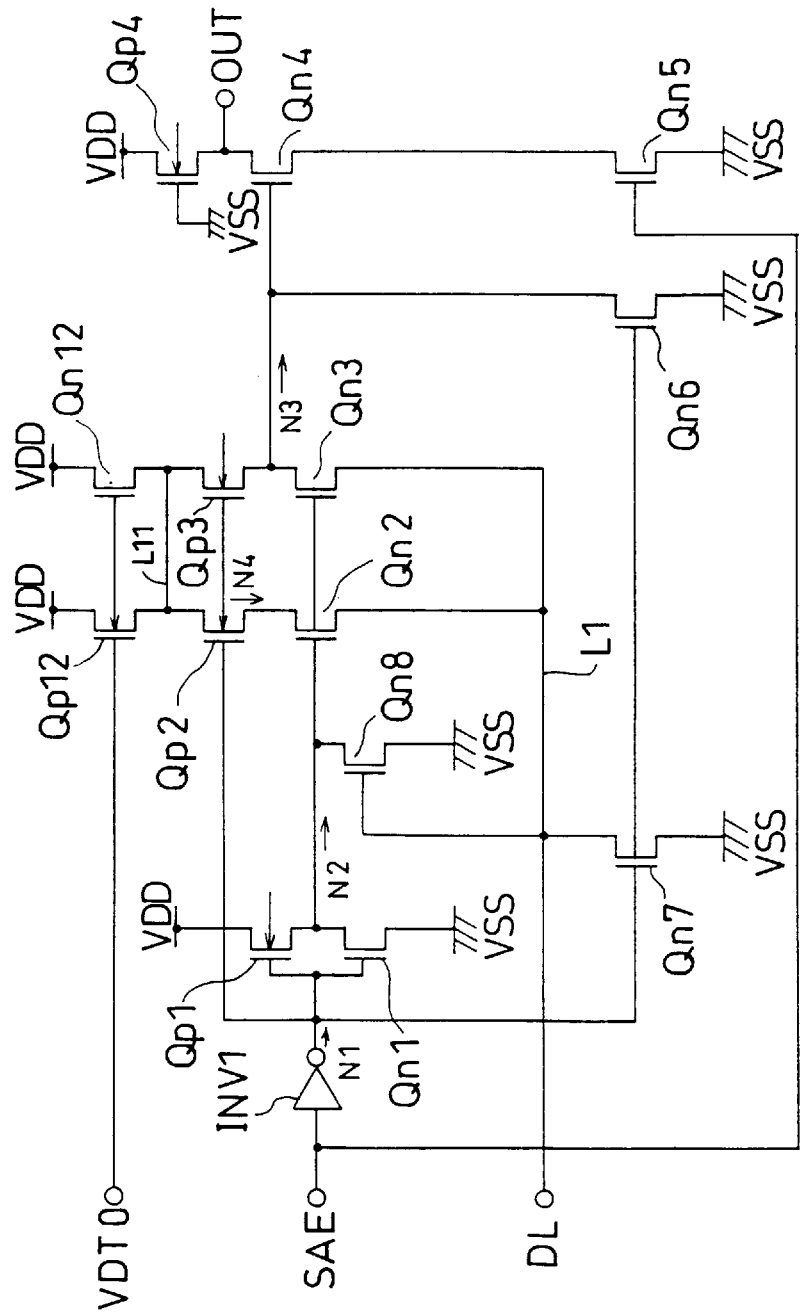
FIG. 8 is an electric circuit diagram of a sense amplifier of Embodiment 3.

FIG. 8 is an electric circuit diagram of a sense amplifier for a semiconductor device of this embodiment. Also in this embodiment, the configuration and operation of a fundamental portion of the sense amplifier is similar to that of the conventional sense amplifier shown in FIG. 40.

This sense amplifier additionally comprises a P-channel MOS transistor Qp12 and an N-channel MOS transistor Qn12 that receive a voltage detecting signal VDT0 at their gates. The source of the transistor Qp12 is connected to a terminal for supplying a supply voltage VDD, and the drain thereof is connected to the source of a transistor Qp2 disposed in the fundamental portion. The drain of the transistor Qn12 is connected to a terminal for supplying a supply voltage VDD, and the source thereof is connected to the source of a transistor Qp3 disposed in the fundamental portion. A signal line connecting the drain of the transistor Qp12 to the source of the transistor Qp2 is connected to a signal line connecting the source of the transistor Qn12 to the source of the transistor Qp3 via a common signal line L11.

The case where, for example, the voltage detector shown in FIG. 2 is used for the sense amplifier of this embodiment will be exemplified. As is described in Embodiment 1 referring to FIG. 4, the voltage detecting signal VDT0 is at a low level under application of a low voltage, and is at a high level under application of a high voltage. When the voltage detecting signal VDT0 is at a high level, the transistor Qp12 is off and the transistor Qn12 is on. Therefore, the source potential of the transistors Qp2 and Qp3 is decreased by the threshold value of the transistor Qn12. When the voltage detecting signal VDT0 is at a low level, the transistor Qp12 is on and the transistor Qn12 is off. Therefore, the source potential of the transistors Qp2 and Qp3 is equal to the supply voltage VDD. Thus, the source potential of the transistors Qp2 and Qp3 is varied by turning on/off the transistors Qp12 and Qn12. The voltage characteristic of a data line (i.e., a signal line L1) is changed by using this variation of the source potential. Therefore, similarly to the conventional sense amplifier, when a current flows through the data line (signal line L1), the output signal OUT is output at a high level, and when no current flows through the data line (signal line L1), the output signal OUT is output at a low level. The data line voltage, however, is discontinuously varied depending upon the logical value of the voltage detecting signal VDT0.

Figure 9:
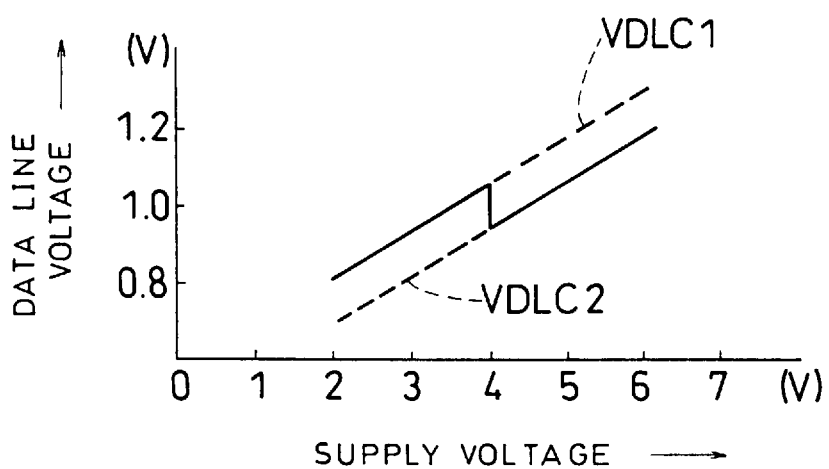
FIG. 9 is a characteristic diagram showing the relationship between a data line voltage and a supply voltage in Embodiment 3.

FIG. 9 is a characteristic diagram showing the relationship between the data line voltage and the supply voltage VDD obtained when the voltage detecting signal VDT0 output by the voltage detector of FIG. 2 is used as an input signal for the sense amplifier. As is shown in FIG. 9, when the supple voltage VDD is as low as 4 V or less, the data line voltage is changed in accordance with a characteristic line VDLC1. When the supply voltage VDD is as high as to exceed 4 V, the data line voltage is changed in accordance with a characteristic line VDLC2 obtained by moving the characteristic line VDLC1 downward.

Thus, in the semiconductor device of Embodiment 3, the threshold voltage of a memory cell transistor is prevented from increasing because the data line voltage does not become excessively high. As a result, a current under application of a voltage to the gate of the memory cell transistor never decreases, resulting in effectively preventing error discrimination by the sense amplifier.

(Embodiment 4)

Now, Embodiment 4 will be described referring to FIGS. 10 and 11.

Figure 10:
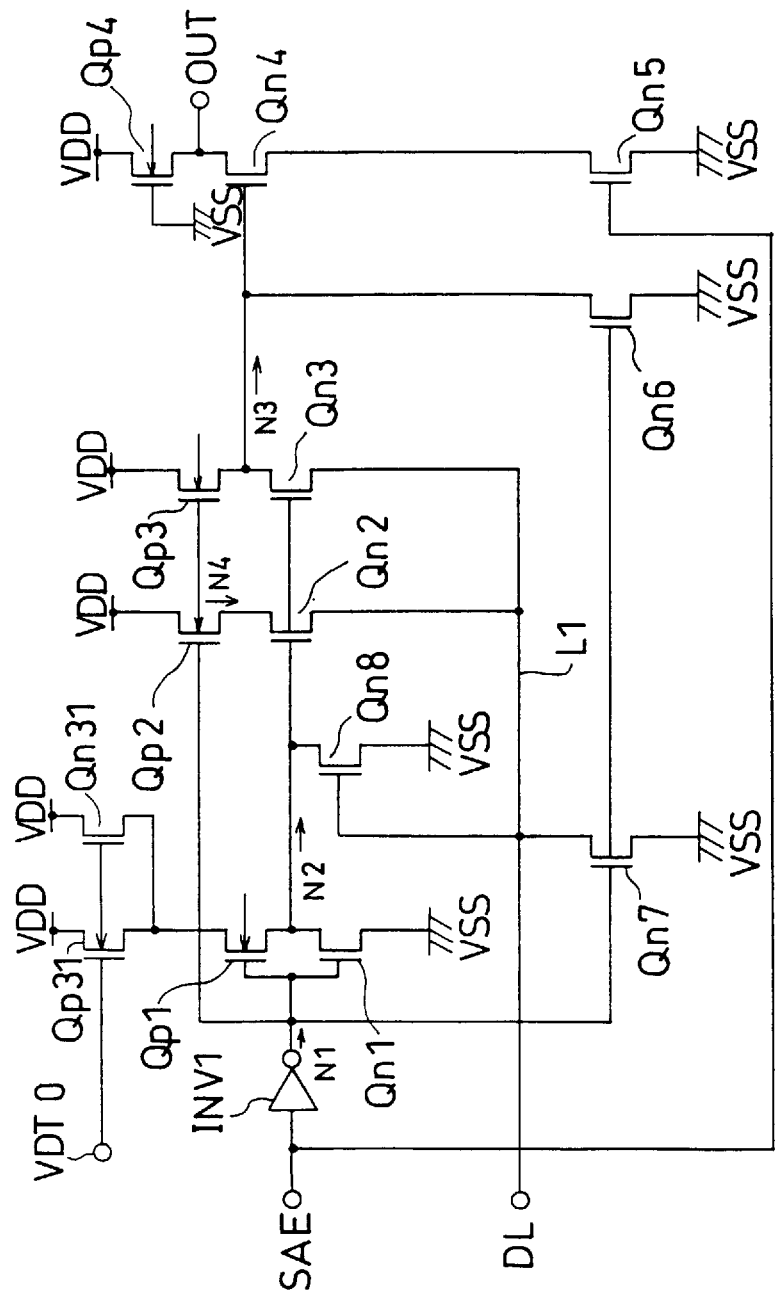
FIG. 10 is an electric circuit diagram of a sense amplifier of Embodiment 4.
Figure 11:
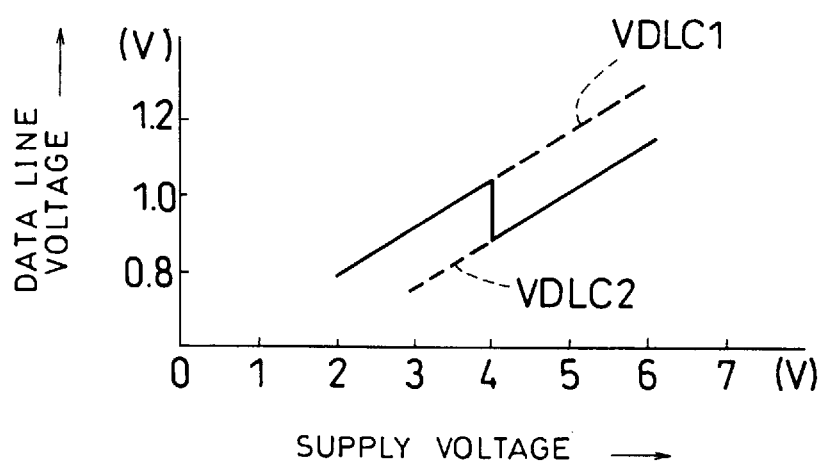
FIG. 11 is a characteristic diagram showing the relationship between a data line voltage and a supply voltage in Embodiment 4.

FIG. 10 is an electric circuit diagram of a sense amplifier for a semiconductor device of Embodiment 4. Also in this embodiment, the configuration and operation of a fundamental portion of the sense amplifier is similar to that of the conventional sense amplifier of FIG. 40.

The sense amplifier of this embodiment additionally comprises a P-channel MOS transistor Qp31 and an N-channel MOS transistor Qn31 that receive a voltage detecting signal VDT0 at their gates. The source of the transistor Qp31 is connected to a terminal for supplying a supply voltage VDD and the drain thereof is connected to the source of a transistor Qp1 disposed in the fundamental portion. The drain of the transistor Qn31 is connected to a terminal for supplying a supply voltage VDD, and the source thereof is connected to the source of the transistor Qp1 together with the drain of the transistor Qp31.

The case where, for example, the voltage detector of FIG. 2 is used for this sense amplifier will be exemplified. As is described in Embodiment 1 referring to FIG. 4, the voltage detecting signal VDT0 is at a low level under application of a low voltage, and is at a high level under application of a high voltage. When the voltage detecting signal VDT0 is at a high level, the transistor Qp31 is off and the transistor Qn31 is on. When the voltage detecting signal VDT0 is at a low level, the transistor Qp31 is on and the transistor Qn31 is off. Thus, the source potential of the transistor Qp1 is varied by turning on/off the transistors Qp31 and Qn31. The voltage characteristic of a data line (i.e., a signal line L1) is changed by using this variation of the source potential of the transistor Qp1.

The sense amplifier of this embodiment is operated similarly to that of Embodiment 3. FIG. 11 is a characteristic diagram showing the relationship between the data line voltage and the supply voltage VDD in this embodiment. As is shown in FIG. 11, the data line voltage is changed in accordance with a characteristic line VDLC1 under application of a low voltage of 4 V or less, and is changed in accordance with a characteristic line VDLC2 obtained by moving the characteristic line VDLC1 downward under application of a high voltage exceeding 4 V. Therefore, the sense amplifier of this embodiment can attain the same effect as that of Embodiment 3.

(Embodiment 5)

Now, Embodiment 5 will be described referring to FIGS. 12 and 13.

Figure 12:
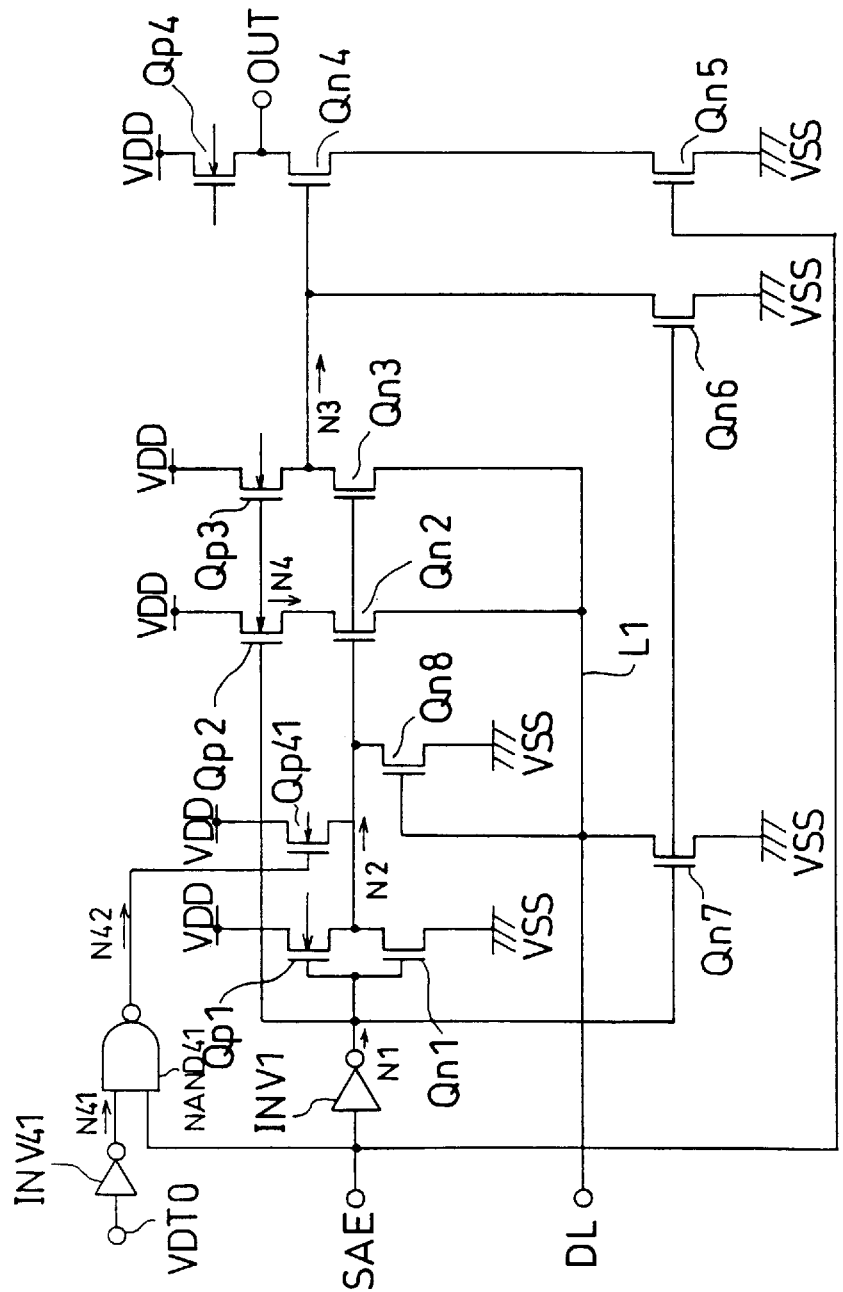
FIG. 12 is an electric circuit diagram of a sense amplifier of Embodiment 5.

FIG. 12 is an electric circuit diagram of a sense amplifier for a semiconductor device of Embodiment 5. Also in this embodiment, the configuration and operation of a fundamental portion of the sense amplifier is similar to that of the conventional sense amplifier of FIG. 40.

The sense amplifier of this embodiment additionally comprises an inverter INV41 that receives a voltage detecting signal VDT0 and generates a signal N41 by inverting the voltage detecting signal VDT0, a NAND circuit NAND41 that receives the signal N41 and a control signal SAE and outputs a signal N42 generated through the NAND operation of these signals and a P-channel MOS transistor Qp41 that receives the signal N42 at its gate. The source of the transistor Qp41 is connected to a terminal for supplying a supply voltage VDD, and the drain thereof is connected to a signal line through which an output signal N2 of a CMOS inverter including transistors Qp1 and Qn1 in the fundamental portion flows.

The case where, for example, the voltage detector of FIG. 2 is used for this sense amplifier will be exemplified. As is described in Embodiment 1 referring to FIG. 4, the voltage detecting signal VDT0 is at a low level under application of a low voltage, and is at a high level under application of a high voltage. Merely when the control signal SAE is at a high level and the voltage detecting signal VDT0 is at a low level, the transistor Qp41 is on, and in the remaining cases the transistor Qp41 is off. The potential of the signal N2 is varied by turning on/off the transistor Qp41, and the voltage characteristic of a data line (i.e., a signal line L1) is changed by using this potential variation of the signal N2.

Also in this embodiment, the operation of the sense amplifier is similar to that of Embodiment 3. FIG. 13 is a characteristic diagram shoving the relationship between the data line voltage and the supply voltage VDD in this embodiment. As is shown in FIG. 11, the data line voltage is changed in accordance with a characteristic line VDLC1 under application of a low voltage of 4 V or less, and is changed in accordance with a characteristic line VDLC2 obtained by moving the characteristic line VDLC1 downward, under application of a high voltage exceeding 4 V. As a result, the sense amplifier of this embodiment also exhibits the same effect as that of Embodiment 3. It is also possible to optionally change the data line voltage by changing the size of the P-channel MOS transistor Qp41.

(Embodiment 6)

Now, Embodiment 6 will be described referring to FIG. 14.

Figure 14:
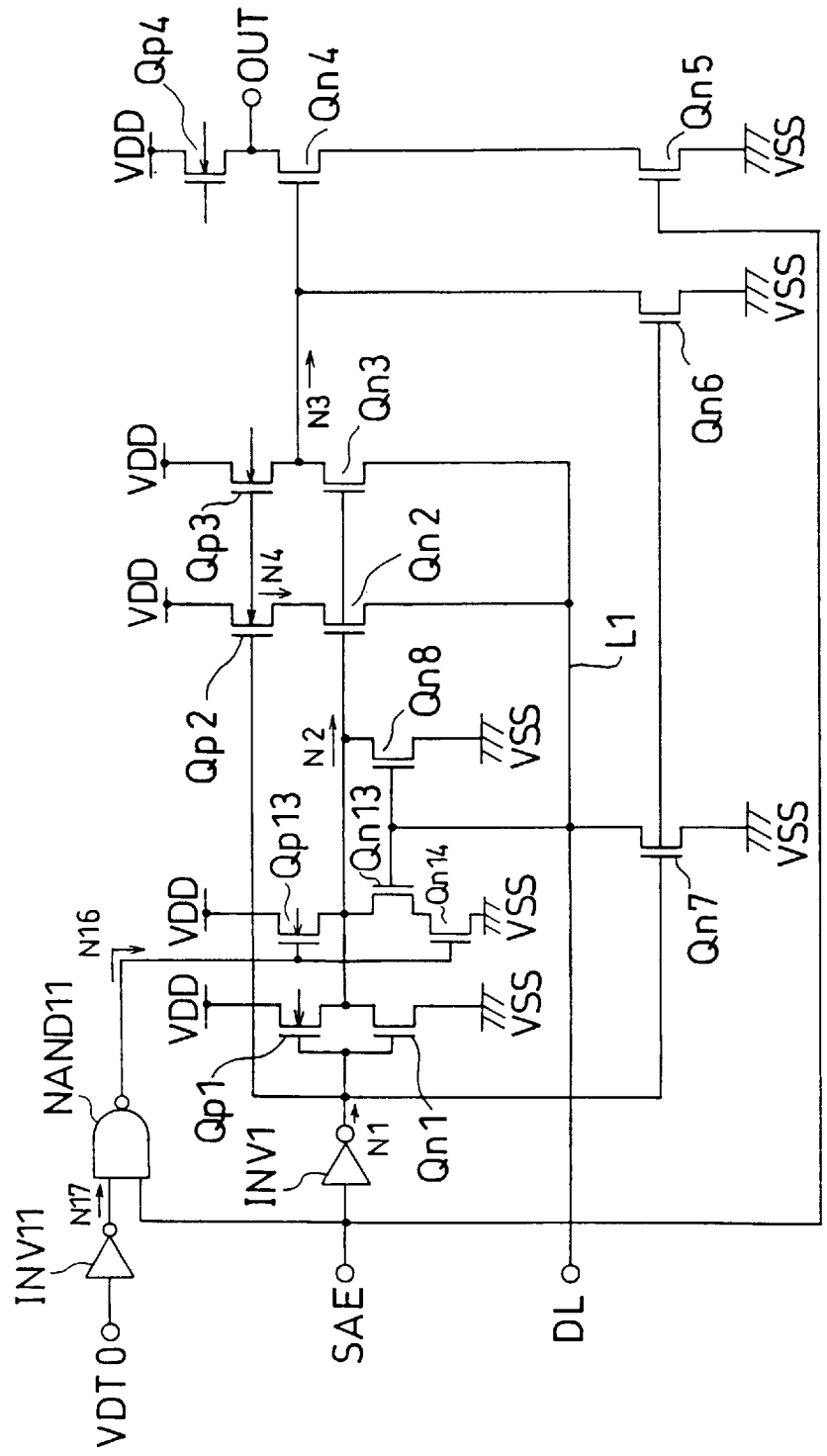
FIG. 14 is an electric circuit diagram of a sense amplifier of Embodiment 6.

FIG. 14 is an electric circuit diagram of a sense amplifier for a semiconductor device of Embodiment 6. Also in this embodiment, the configuration and operation of a fundamental portion of the sense amplifier is similar to that of the conventional sense amplifier of FIG. 40.

The sense amplifier of this embodiment additionally comprises an inverter INV11 that receives a voltage detecting signal VDT0 and outputs a signal N17 generated by inverting the voltage detecting signal VDT0, a NAND circuit NAND11 that receives the signal N17 and a control signal SAE and outputs a signal N16 generated through the NAND operation of these signals. a P-channel MOS transistor Qp13 and an N-channel MOS transistor Qn14 that receive the signal N16 at their gates, and an N-channel MOS transistor Qn13 disposed between the transistors Qp13 and Qn14. The source of the transistor Qp13 is connected to a terminal for supplying a supply voltage VDD and the drain thereof is connected to a signal line through which an output signal N2 of a CMOS inverter including transistors Qp1 and Qn1 in the fundamental portion flows. The source of the transistor Qn14 is grounded, and the drain thereof is connected to the source of the transistor Qn13. The drain of the transistor Qn13 is connected to the signal line through which the output signal N2 of the CMOS inverter including the transistors Qp1 and Qn1 flows, together with the drain of the transistor Qp13, and the gate thereof is connected to the gate of a transistor Qn8 disposed in the fundamental portion.

The case where for example, the voltage detector of FIG. 2 is used for this sense amplifier will be exemplified. As is described in Embodiment 1 referring to FIG. 4, the voltage detecting signal VDT0 is at a low level under application of a low voltage, and is at a high level under application of a high voltage. Merely when the control signal SAE is at a high level and the voltage detecting signal VDT0 is at a low level the transistor Qp13 is on and the transistor Qn14 is off. In the remaining cases, the transistor Qp13 is off and the transistor Qn14 is on. The transistor Qn13 is operated similarly to the transistor Qn8. The potential of the signal N2 is varied by turning on/off the transistors Qp13, Qn13 and Qn14, and the voltage characteristic of a data line (i.e., a signal line L1) is changed by using this potential variation of the signal N2.

Figure 13:
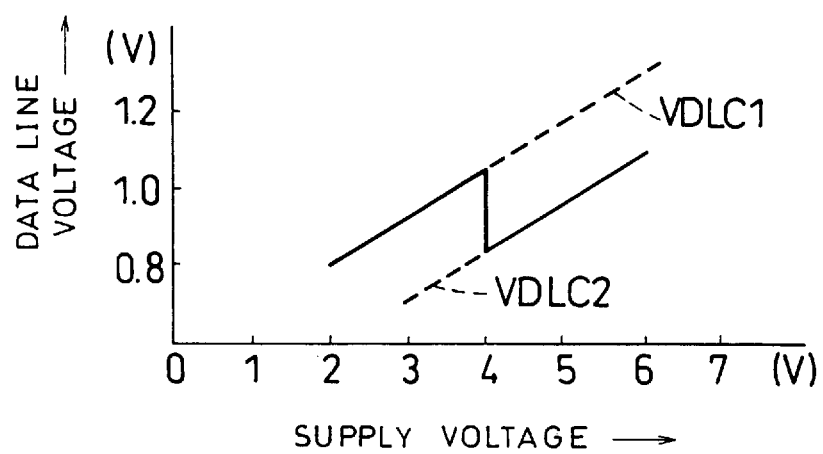
FIG. 13 is a characteristic diagram showing the relationship between a data line voltage and a supply voltage in Embodiment 5.

In the operation of this sense amplifier, the data line voltage is varied in accordance with the voltage detecting signal VDT0 in the same manner as in Embodiment 5 shown in FIG. 13. Specifically, the data line voltage exhibits a characteristic according to the characteristic line VDLC1 under application of a low voltage, and a characteristic according to the characteristic line VDLC2 under application of a high voltage.

Thus, the sense amplifier of this embodiment also can attain the same effect as that of Embodiment 3. Furthermore, it is also possible to optionally change the data line voltage by varying the sizes of the P-channel MOS transistor Qp13 and the N-channel MOS transistor Qn14.

(Embodiment 7)

Embodiment 7 will now be described referring to FIG. 15. The configuration of a voltage detector alone will be described herein, and any sense amplifier described in the foregoing embodiments can be adopted in this embodiment.

Figure 15:
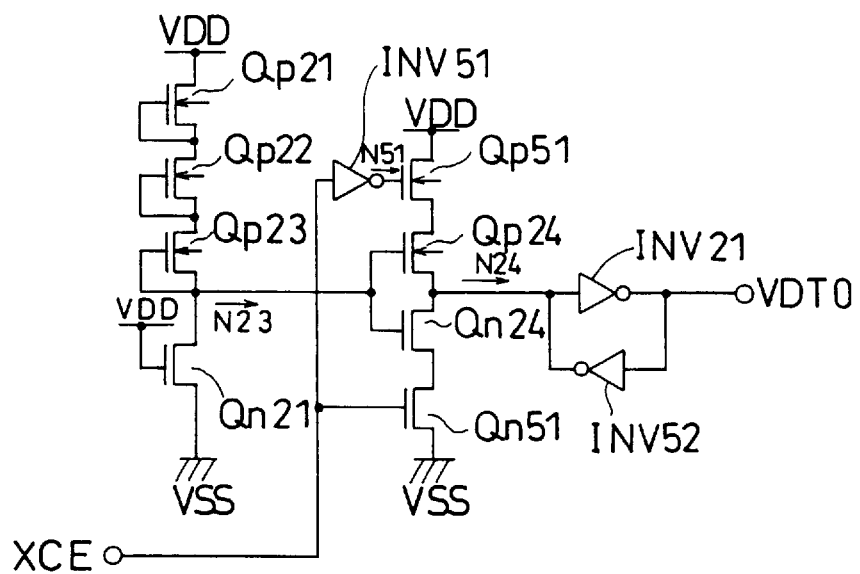
FIG. 15 is an electric circuit diagram of a voltage detector of Embodiment 7.

FIG. 15 is an electric circuit diagram of the voltage detector for a semiconductor device of this embodiment. As is shown in FIG. 15, the configuration of the voltage detector is basically identical to that of Embodiment 1 shown in FIG. 2. Specifically, the voltage detector comprises transistors Qp21 through Qp23, a CMOS inverter including transistors Qp24 and Qn24 and an inverter INV21.

This voltage detector further comprises an inverter INV51 that receives a control signal XCE and outputs a signal N51 generated by inverting the control signal XCE, a P-channel MOS transistor Qp51 that receives the signal N51 at its gate, an N-channel MOS transistor Qn51 that receives the control signal XCE at its gate, and an inverter INV52 for inverting an output signal VDT0 of the inverter INV21 and supplying the inverted signal to the inverter INV21. The source of the transistor Qp51 is connected to a terminal for supplying a supply voltage VDD, and the drain thereof is connected to the source of the transistor Qp24. The source of the transistor Qn51 is grounded, and the drain thereof is connected to the source of the transistor Qn24. Owing to this configuration, when the control signal XCE is at a high level, both the transistors Qp51 and Qn51 are on, thereby allowing the CMOS inverter to output a signal N24. When the control signal XCE is at a low level, the transistors Qp51 and Qn51 are turned off, thereby inhibiting the CMOS inverter from outputting the signal N24. When the signal N24 is not output, the output signal VDT0 is kept to have a current logical value due to the feed back function of the inverter INV52. Thus, by turning on/off the transistors Qp51 and Qn51, the voltage detecting signal VDT0 is allowed to undergo a low to high or a high to low transition merely when the control signal XCE is at a high level.

In the voltage detector of this embodiment, the logical voltage of the voltage detecting signal VDT0 undergoes a transition merely when the logical voltage of the control signal XCE is "H". Accordingly, when, for example, the logical voltage of the control signal XCE is "L" and the semiconductor device is placed in an operable state, the logical voltage of the voltage detecting signal VDT0 does not undergo a transition. In this manner, the malfunction of the circuit using the voltage detecting signal VDT0 during the operation can be avoided.

It is noted that the sense amplifiers and the voltage detectors described in the foregoing embodiments can be freely combined, and that the combinations described in the embodiments do not limit the invention.

(Embodiment 8)

Now, Embodiment 8 will be described referring to FIGS. 16 through 18.

Figure 16:
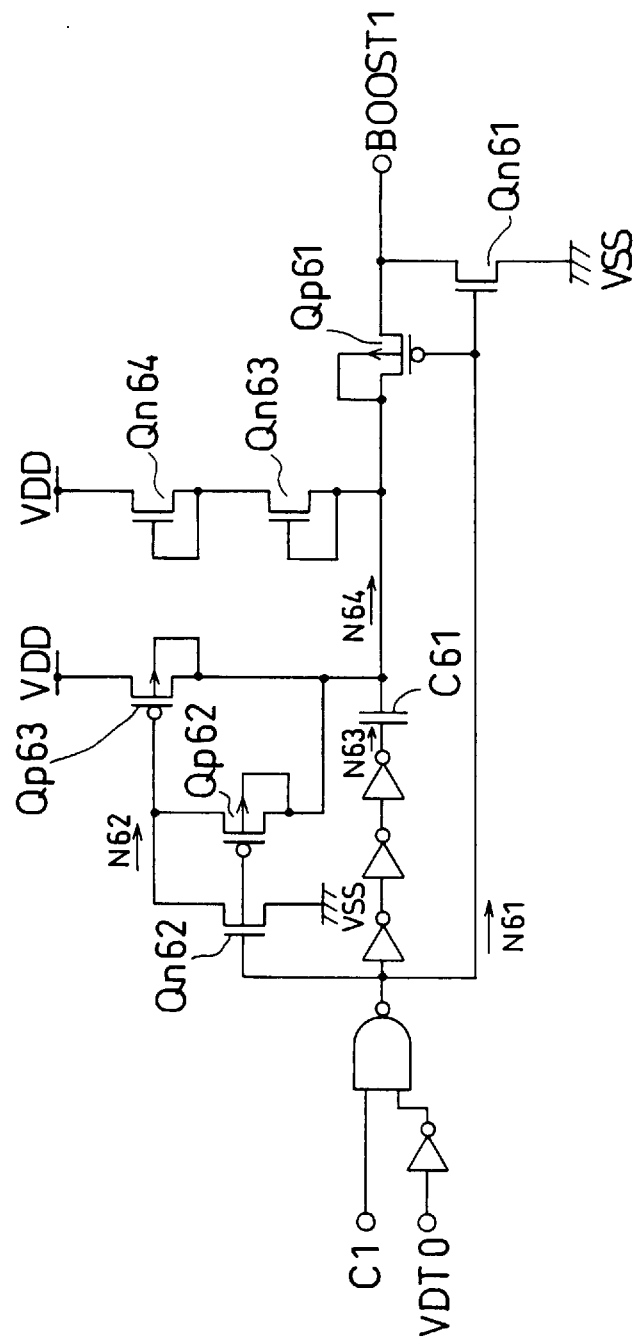
FIG. 16 is an electric circuit diagram of a booster of Embodiment 8.

FIG. 16 is an electric circuit diagram of a booster for a semiconductor device of this embodiment. In this circuit, it is selected whether or not the booster is operated in accordance with a voltage detecting signal VDT0 output by any of the voltage detectors described in the foregoing embodiments. Also in this embodiment, the supply voltage dependent characteristic of the level sensing current in the sense amplifier is varied according to the voltage detecting signal VDT0 as in Embodiment 1.

In the booster of FIG. 16, an output signal (booster node) BOOST1 is boosted by using the voltage detecting signal VDT0 and a control signal C1, and, for example, the voltage detector of FIG. 2 can be used. As is shown in FIG. 16, the booster comprises, in the former stage, an inverter that receives the voltage detecting signal VDT0 and outputs a signal generated by inverting the voltage detecting signal VDT0 and a NAND circuit for outputting a signal N61 generated through the NAND operation of the inverted signal of the voltage detecting signal VDT0 and the control signal C1. The booster further comprises, subsequently to these circuits, three inverters for triply inverting the signal N61, a capacitor C61 one of whose electrode is connected to the output port of the three inverters, an N-channel MOS transistor Qn62 and a P-channel MOS transistor Qp62 that receive the signal N61 at their gates, and a P-channel MOS transistor Qp63 whose gate is connected to the drain of the transistor Qn62 and the source thereof. The source of the transistor Qn62 is grounded. The source of the transistor Qp63 is connected to a terminal for supplying a supply voltage VDD, and the drain thereof is connected to the other electrode of the capacitor C61, together with the drain of the transistor Qp62. Specifically, one electrode of the capacitor C61 is supplied with a signal N63 generated through the triple inversion of the signal N61, and the other is supplied with an output signal N64 from the transistors Qp62 and Qp63. Between a signal line through which the signal N64 flows and a terminal for supplying a supply voltage VDD are disposed two N-channel MOS transistors Qn63 and Qn64 connected in series to each other. This circuit further comprises a P-channel MOS transistor Qp61 and an N-channel MOS transistor Qn61 that receive the signal N61 at their gates. The drain of the transistor Qp61 is connected to the signal line through which the signal N64 flows, and the source thereof is connected to a terminal for outputting the output signal BOOST1. together with the drain of the transistor Qn61. The source of the transistor Qn61 is grounded.

Owing to this configuration, when the signal N61 undergoes a high to low transition, the output signal (booster node) BOOST1 is boosted from a voltage level of a ground voltage VSS up to a voltage level higher than the supply voltage VDD. In other words, when the voltage detecting signal VDT0 is at a low level and the control signal C1 undergoes a low to high transition, the output signal BOOST1 is boosted. When the voltage detecting signal VDT0 is at a high level, the output signal BOOST1 is not boosted.

Figure 17:
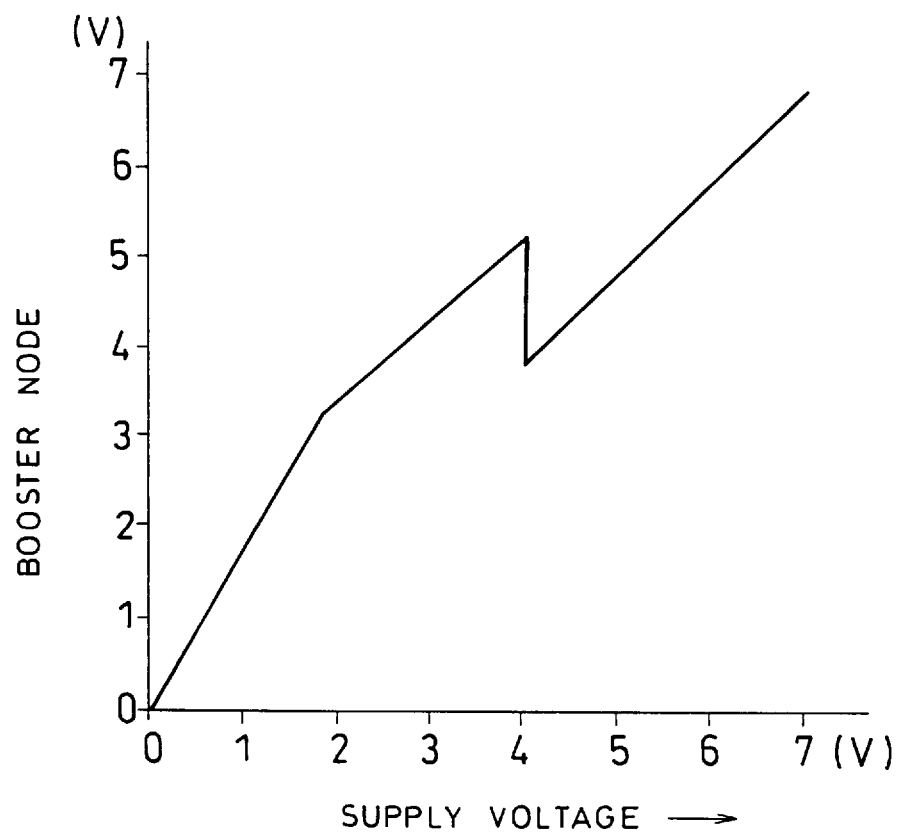
FIG. 17 is a characteristic diagram showing the relationship between a booster node and a supply voltage in Embodiment 8.

FIG. 17 is a characteristic diagram showing the relationship between the supply voltage VDD and the output signal (booster node) BOOST1. When the supply voltage VDD exceeds 4 V, the output signal BOOST1 is not boosted and remained approximately at a level of the supply voltage. When the supply voltage VDD is below 4 V, the output signal BOOST1 is boosted so as to be higher than the supply voltage VDD.

In using such a booster that is actuated based on the voltage detecting signal VDT0 merely when the supply voltage VDD is low, it is possible to speed up and stabilize the operation by boosting the gate of a memory cell transistor and a selective transistor for a bit line under application of a low voltage. Under application of a high voltage, it is possible to effectively avoid the degradation of the transistors due to an excessively high voltage, by not actuating the booster. Thus, this booster can be used in a wide range of the supply voltage expanding from the low supply voltage region to the high supply voltage region.

Figure 18:
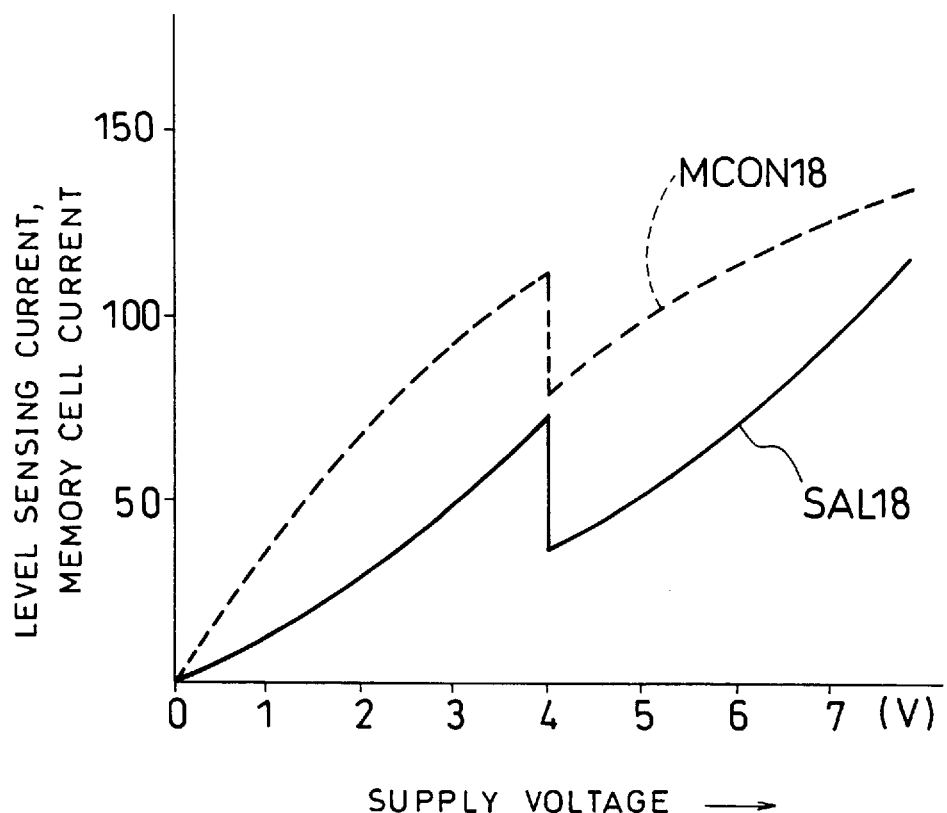
FIG. 18 is a characteristic diagram showing the relationship among a level sensing current, a memory cell current and a supply voltage in Embodiment 8.

FIG. 18 is a characteristic diagram showing the relationship between the supply voltage VDD and a memory cell current (shown with a broken curve MCON18) and the relationship between a supply voltage VDD and a level sensing current (shown with a solid curve SAL18). The curve MCON18 shows the supply voltage dependence of the level sensing current obtained when the level sensing current of the sense amplifier is switched by using the voltage detecting signal VDT0 of Embodiment 1. The curve SAL18 shows the supply voltage dependence of the memory cell current obtained when the gate voltage of the memory cell transistor is switched by using the booster of this embodiment. As is apparent from the curve SALC18, the level sensing current is discontinuously increased when the supply voltage VDD is below 4 V and is indicated as a curve swelling downward in each voltage region. As is shown with the curve MCON18, the memory cell current is also discontinuously increased when the supply voltage VDD is below 4 V, and is shown as a curve swelling upward in each voltage region. The supply voltage dependent characteristic of the level sensing current is thus switched combinationally with whether or not the cell transistor is boosted by using the voltage detecting signal VDT0 at the same set value (for example, 4 V). As a result, it is possible to maintain a satisfactory relationship between the memory cell current and the level sensing current regardless of the supply voltage VDD. This results in a stabilized operation in a wide range of the supply voltage.

(Embodiment 9)

Embodiment 9 will now be described referring to FIGS. 19 and 20.

Figure 19:
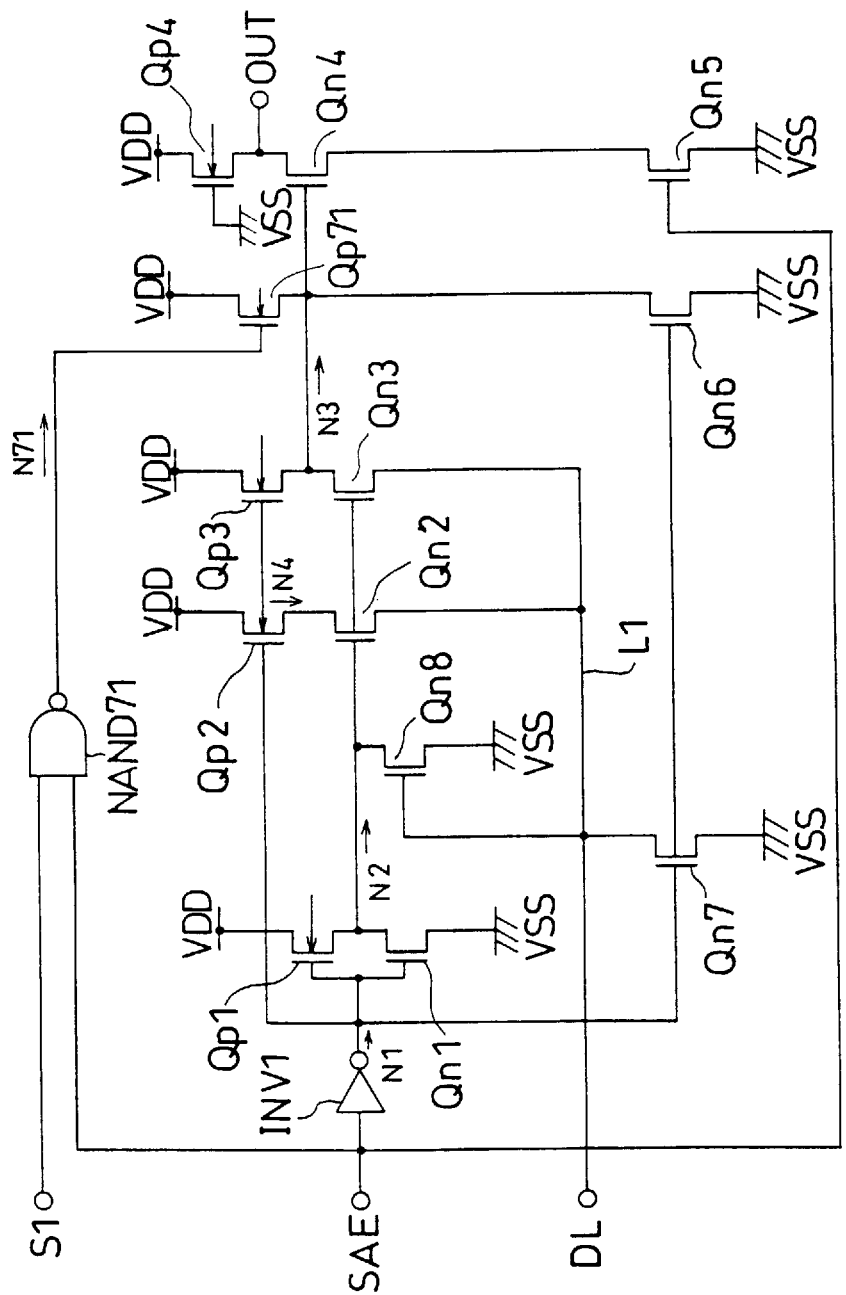
FIG. 19 is an electric circuit diagram of a sense amplifier of Embodiment 9.

FIG. 19 is an electric circuit diagram showing the configuration of a sense amplifier for a semiconductor device of Embodiment 9. Also in this embodiment, the configuration and operation of a fundamental portion of the sense amplifier is similar to that of the conventional sense amplifier of FIG. 40.

In embodiments described hereinafter, a current flowing through a memory cell in an on state is designated as a "memory cell on current", and a current flowing through a memory cell in an off state is designated as a "memory cell off current". The sense amplifier of this embodiment comprises an input terminal for a control signal S1, which is deactivated in a reading operation and is activated in discriminating (verifying) a memory cell on current. The sense amplifier is additionally provided with a NAND circuit NAND71 that receives the control signal S1 and a control signal SAE and outputs a signal N71 generated through the NAND operation of these signals, and a P-channel MOS transistor Qp71 that receives the signal N71 at its gate. The source of the transistor Qp71 is connected to a terminal for supplying a supply voltage VDD, and the drain thereof is connected to a signal line through which a signal N3 flows to be applied to the gate of a transistor Qn4 disposed in an output unit in the fundamental portion.

The sense amplifier is operated when the logical voltage of the control signal SAE is "H", so as to output an output signal OUT at a high level when a current flows through a data line (signal line L1) and to output an output signal OUT at a low level when no current flows through the data line (signal line L1). This operation is identical to that of the conventional sense amplifier. In the reading operation by this sense amplifier, the control signal S1 is at a low level although the control signal SAE is at a high level. Therefore, the output signal N71 of the NAND circuit NAND71 is at a high level, and hence, the transistor Qp71 is not operated, resulting in the similar operation to that of the conventional sense amplifier. In discriminating (verifying) a memory cell on current, both the control signals SAE and S1 are at a high level, and hence the signal N71 is at a low level, thereby allowing the transistor Qp71 to be operated. Thus, the potential level of the signal N3 is increased so as to switch the supply voltage dependent characteristic of the level sensing current.

Figure 20:
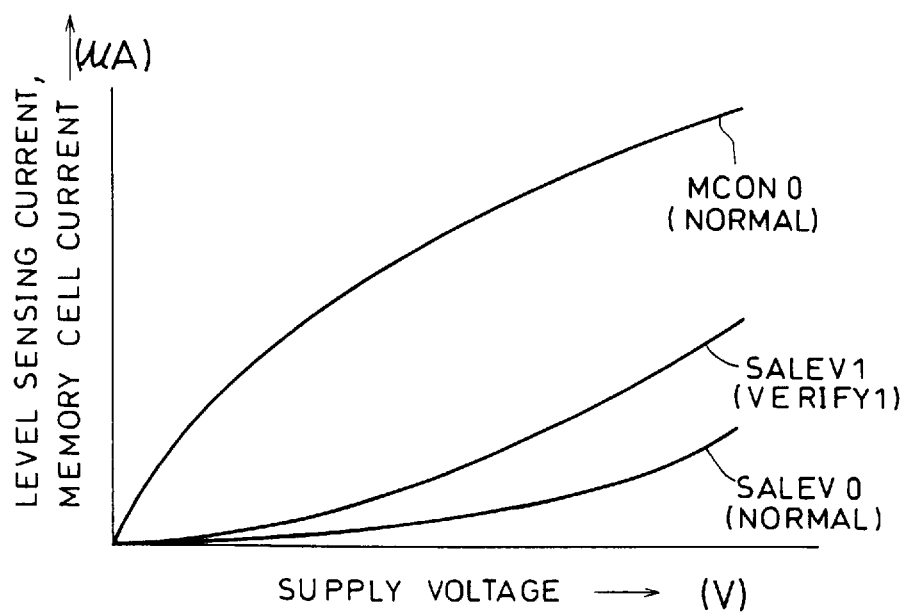
FIG. 20 is a characteristic diagram showing the relationship among a level sensing current, a memory cell current and a supply voltage in the sense amplifier of Embodiment 9.

FIG. 20 illustrates the relationship among a supply voltage VDD, a memory cell current and a level sensing current in the sense amplifier of this embodiment. Since the control signal S1 is at a low level in the reading operation, the level sensing current exhibits a characteristic according to a curve SALEV0. In discriminating (verifying) a memory cell on current, the control signal S1 is at a high level, and hence, the level sensing current exhibits a characteristic according to a curve SALEV1 positioned above the curve SALEV0.

According to this embodiment, by increasing the level sensing current in discriminating a memory cell on current as compared with that in the reading operation, it is possible to discriminate the memory cell on current with margin, thereby increasing the reliability of the semiconductor device.

(Embodiment 10)

Embodiment 10 will now be described referring to FIGS. 21 and 22.

Figure 21:
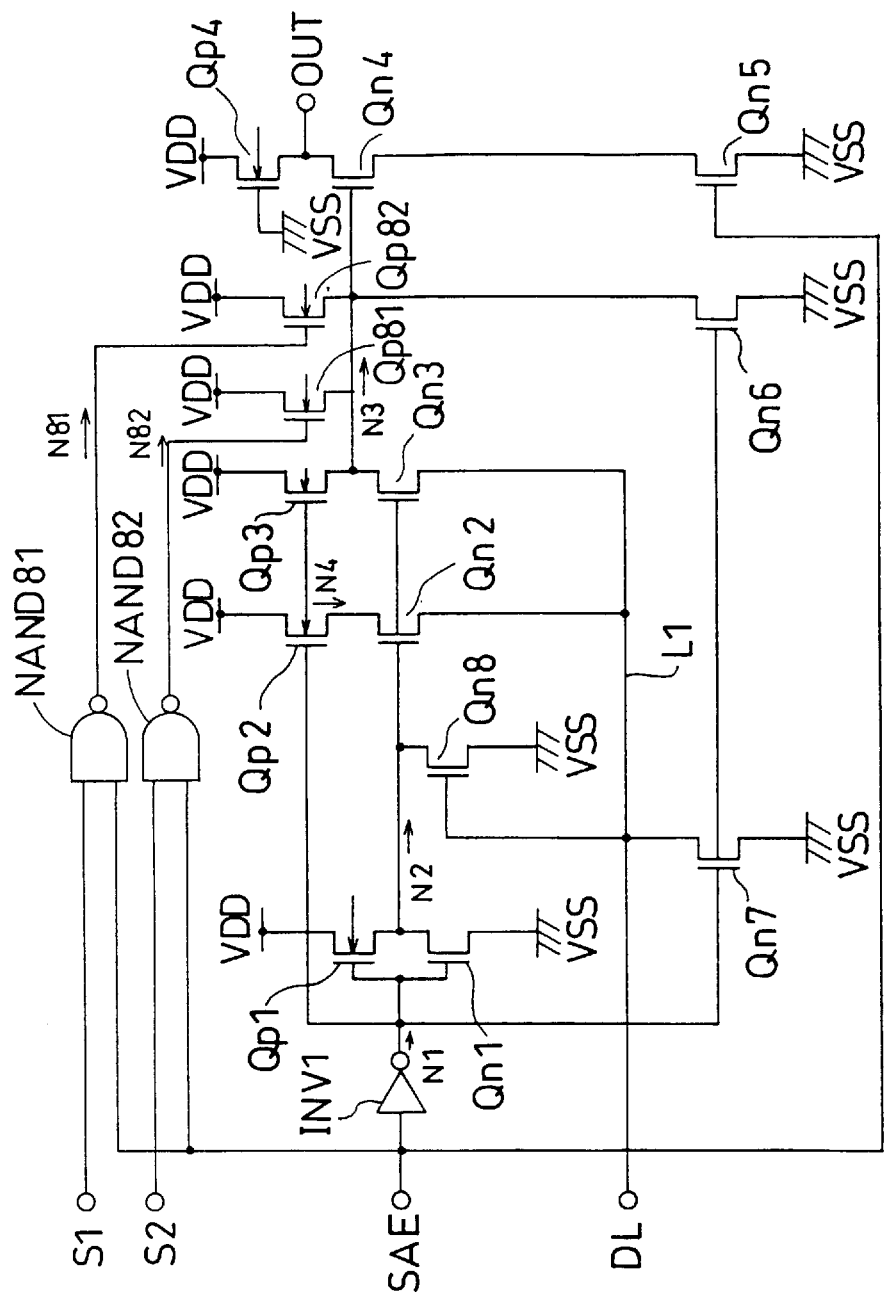
FIG. 21 is an electric circuit diagram of a sense amplifier of Embodiment 10.

FIG. 21 is an electric circuit diagram showing the configuration of a sense amplifier for a semiconductor device of Embodiment 10. Also in this embodiment, the configuration and operation of a fundamental portion of the sense amplifier is similar to that of the conventional sense amplifier shown in FIG. 40.

This sense amplifier further comprises two terminals for a control signal S1, which is activated merely in discriminating a memory cell on current in a first mode, and a control signal S2, which is activated merely in discriminating a memory cell on current in a second mode, respectively. The sense amplifier is further provided with a NAND circuit NAND81 that receives the control signal S1 and a control signal SAE and outputs a signal N81 generated through the NAND operation of these signals, a NAND circuit NAND82 that receives the control signal S2 and the control signal SAE and outputs a signal N82 generated through the NAND operation of these signals, and P-channel MOS transistors Qp81 and Qp82 that receive the signals N81 and N82 at their gates, respectively. The sources of the transistors Qp81 and Qp82 are respectively connected to terminals for supplying a supply voltage VDD, and the drains thereof are connected to a signal line through which a signal N3 flows to be applied to the gate of a transistor Qn4 in an output unit disposed in the fundamental portion.

The circuit operation of this sense amplifier is similar to that of Embodiment 9. Specifically, when the control signal S1 is at a high level, the transistor Qp81 is on, and when the control signal S2 is at a high level, the transistor Qp82 is on. The transistors Qp81 and Qp82 have different sizes from each other, and the supply voltage dependent characteristic of the level sensing current is switched between two patterns in discriminating (verifying) a memory cell on current.

Figure 22:
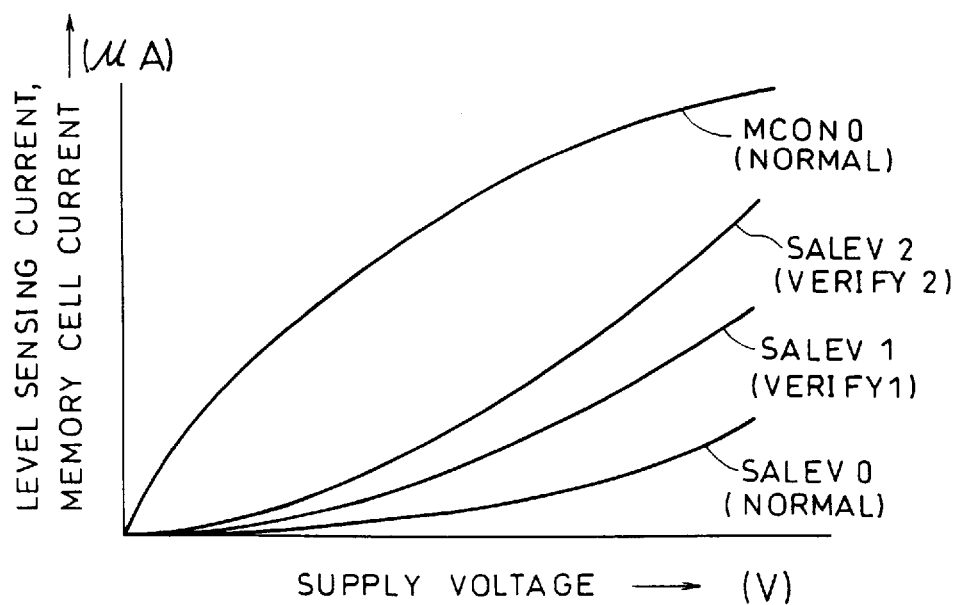
FIG. 22 is a characteristic diagram showing the relationship among a level sensing current, a memory cell current and a supply voltage in the sense amplifier of Embodiment 10.

FIG. 22 is a characteristic diagram showing the supply voltage dependence of a memory cell current and a level sensing current in this embodiment. In this embodiment, when both the control signals S1 and S2 are at a low level, the sense level current exhibits a general characteristic according to a curve SALEV0. When the control signal S1 is at a high level and the control signal S2 is at a low level, it exhibits a characteristic according to a curve SALEV1 for the discrimination in the first mode. When the control signal S1 is at a low level and the control signal S2 is at a high level, it exhibits a characteristic according to a curve SALEV2 for the discrimination in the second mode.

In the discrimination by this sense amplifier, the supply voltage dependence of the level sensing current is thus switched between two patterns. Therefore, the sense amplifier can perform the discrimination in the following two modes: The discrimination in the second mode adopting the level sensing current characteristic shown as the curve SALEV2 is generally used by a manufacturer of the semiconductor devices in the initial test, where strict discrimination with large margin is performed so as to avoid the malfunction even when a memory cell on current is decreased through usage by a user. The discrimination in the first mode adopting the level sensing current characteristic shown as the curve SALEV1 is used by a user. In this case, the discrimination is performed with slightly larger margin than in the reading operation adopting the level sensing current characteristic shown as the curve SALEV0. In this manner, the sense amplifier can perform discrimination in a plurality of modes, each of which uses a level sensing current having different margin from that used in the reading operation. As a result, the sense amplifier can attain improved reliability.

(Embodiment 11)

Embodiment 11 will now be described referring to FIGS. 23 and 24.

The configuration of a sense amplifier of this embodiment is similar to that of Embodiment 10 shown in FIG. 21, and this sense amplifier can also discriminate a memory cell on current in a plurality of modes as shown in FIG. 22.

Figure 23:
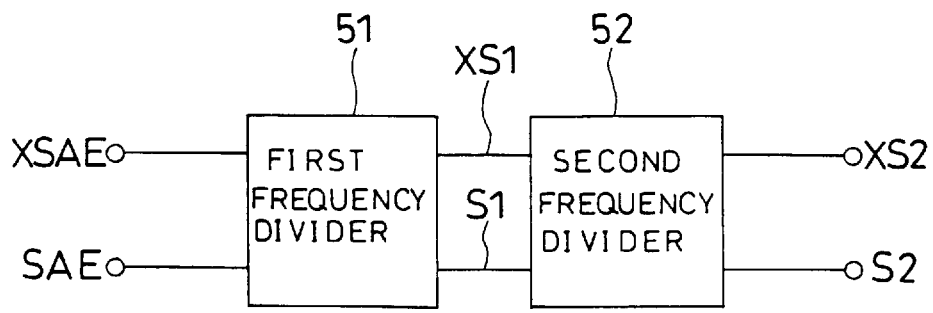
FIG. 23 is an electric circuit diagram of a control signal generator of Embodiment 11.

FIG. 23 is an electric circuit diagram showing the configuration of a control signal generator for a semiconductor device of this embodiment. The control signal generator comprises a first frequency divider 51 and a second frequency divider 52 connected in series to each other. The first frequency divider 51 receives a control signal SAE and a control signal XCE and outputs a control signal S1 and a control signal XS1. The second frequency divider 52 receives the control signal S1 and the control signal XS1 and outputs a control signal S2 and a control signal XS2.

Figure 24:
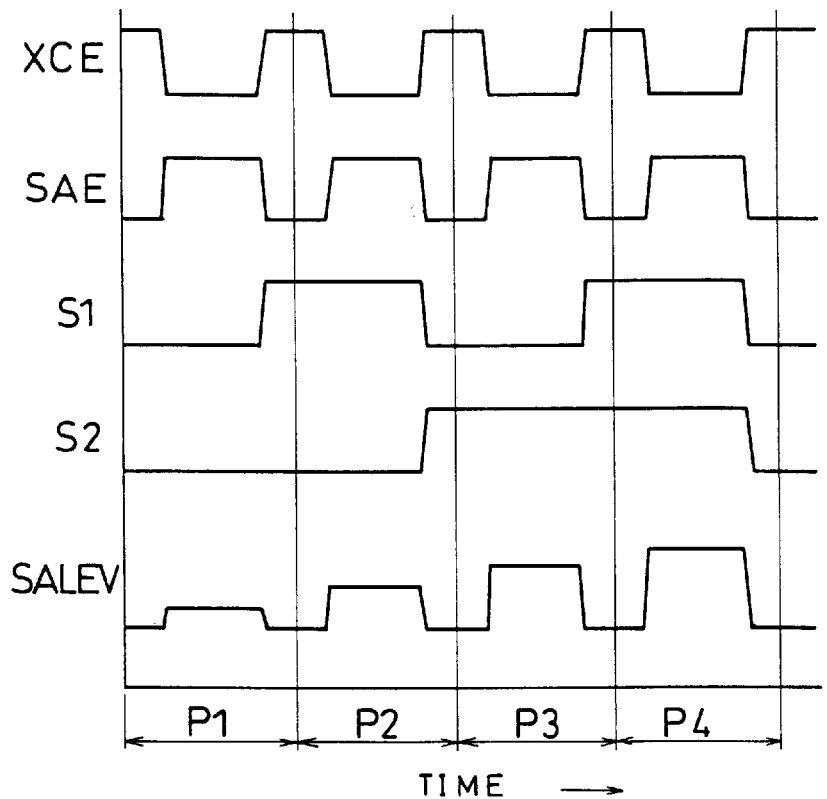
FIG. 24 is a time chart illustrating the waveform of each signal used in Embodiment 11.

FIG. 24 illustrates the waveform of each signal used in this embodiment. The control signal XCE is a select signal (i.e., a chip enable signal) for the semiconductor device, and the chip is enabled when the control signal XCE is at a low level. The control signal SAE is an inverted signal of the control signal XCE. In a period P1, when the control signal XCE undergoes a high to low transition, i.e., when the control signal SAE undergoes a low to high transition, the sense amplifier of FIG. 21 is enabled. At this point, both the control signals S1 and S2 are at a low level, and hence, the level sensing current exhibits a characteristic according to the characteristic curve SALEV0. When the control signal XCE undergoes a low to high transition, the sense amplifier is disabled, the control signal S1 undergoes a low to high transition and the control signal S2 undergoes a high to low transition.

In a period P2, when the control signal XCE undergoes a high to low transition, the sense amplifier is enabled again, and the level sensing current exhibits a characteristic according to the characteristic curve SALEV1. When the control signal XCE undergoes a low to high transition, the sense amplifier is disabled, the control signal S1 undergoes a high to low transition and the control signal S2 undergoes a low to high transition.

In a period P3, when the control signal XCE undergoes a high to low transition, the sense amplifier is enabled, and the level sensing current exhibits a characteristic according to the characteristic curve SALEV2. When the control signal XCE undergoes a low to high transition, the sense amplifier is disabled, and the control signals S1 and S2 undergo a low to high transition.

In a period P4, when the control signal XCE undergoes a high to low transition, the sense amplifier is enabled, and the level sensing current attains a current value larger than a value indicated with the characteristic curve SALEV2. When the control signal XCE undergoes a low to high transition, the sense amplifier is disabled, and the control signals S1 and S2 undergo a low to high transition.

In this manner, the level sensing current value for discriminating a memory cell on current is gradually increased in this embodiment. Therefore, the condition for the discrimination of the memory cell on current becomes gradually more and more strict. When this semiconductor device is applied to, for example, a semiconductor memory having a redundancy recovering function, it is possible to replace a memory cell having a smaller memory cell on current (i.e., having smaller margin) with a redundancy memory cell. Memory cells that can be recovered in view of the capacity of redundancy memory cells are subjected to screening, thereby maximizing the minimum value of distribution of the margin in the memory cells. As a result, the semiconductor memory can attain high reliability.

(Embodiment 12)

Embodiment 12 will now be described referring to FIGS. 25 and 26.

Figure 25:
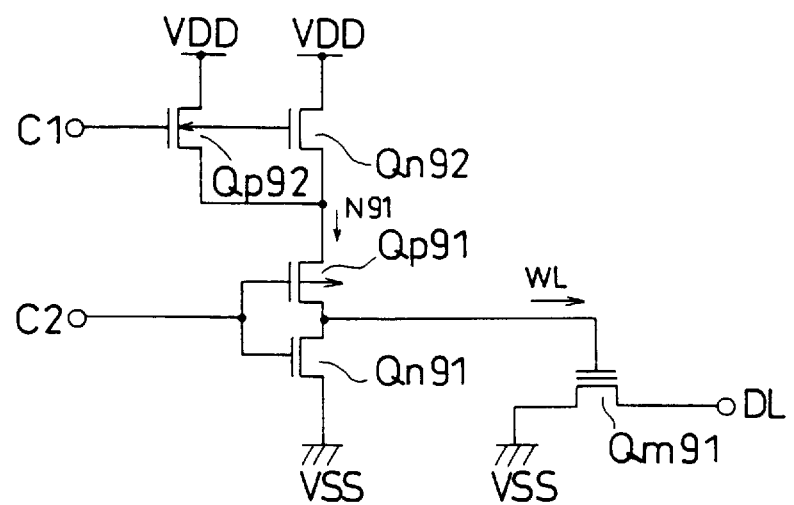
FIG. 25 is an electric circuit diagram of a word line control circuit of Embodiment 12.

FIG. 25 is an electric circuit diagram showing the configuration of a word line control circuit for a semiconductor device of this embodiment. As is shown in FIG. 25, the word line control circuit comprises an input terminal for a control signal C2, which is activated when the device is disabled and is deactivated when it is enabled, an input terminal for a control signal C1, which is deactivated in the reading operation and is activated in discrimination, a CMOS inverter including a P-channel MOS transistor Qp91 and an N-channel MOS transistor Qn91 that receive the control signal C2 at their gates, and a P-channel MOS transistor Qp92 and an N-channel MOS transistor Qn92 that receive the control signal C1 at their gates. An output signal line for the CMOS inverter is connected to a word Line. The source of the transistor Qp92 and the drain of the transistor Qn92 are respectively connected to terminals for supplying a supply voltage VDD, and the drain of the transistor Qp92 and the source of the transistor Qn92 are connected to the source of the transistor Qp91 via a common signal line.

The word line is connected to the gate of a memory cell transistor Qm91. The drain of the memory cell transistor Qm91 is connected to a data line, and the source thereof is grounded. In other words, an output signal N91 of the two transistors Qp92 and Qn92 is applied to the CMOS inverter including the transistors Qn91 and Qp91 serving as the output unit of the word line control circuit, thereby switching the voltage characteristic of a word line signal WL, that is, an output signal of the CMOS inverter by utilizing a difference in the voltage level of the signal N91. Specifically, when the semiconductor device is disabled, the control signal C1 is at a low level and the control signal C2 is at a high level. Therefore, the voltage of the word line signal WL is equal to the ground voltage VSS. In the reading operation, since both the control signals C1 and C2 are at a low level, the voltage of the word line signal WL is equal to the supply voltage VDD. In the discrimination of a memory cell on current, since the control signal C1 is at a high level and the control signal C2 is at a low level, the voltage of the word line signal WL is lower than the supply voltage VDD by the threshold voltage of the N-channel MOS transistor Qn92.

Figure 26:
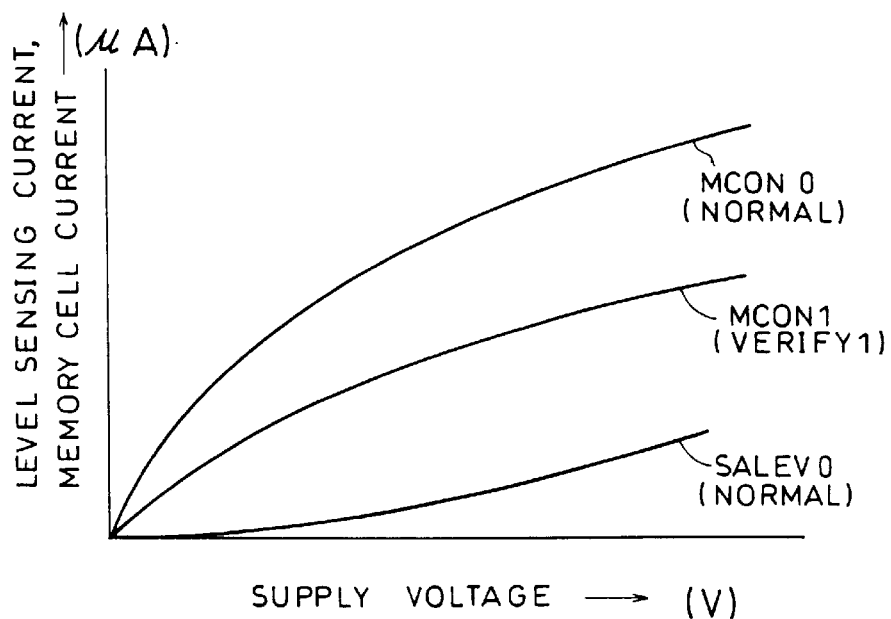
FIG. 26 is a characteristic diagram showing the relationship among a level sensing current, a memory cell current and a supply voltage in a sense amplifier of Embodiment 12.

FIG. 26 shows the relationship among a supply voltage VDD, a level sensing current and a memory cell on current in the semiconductor device including this word line control circuit. A curve SALEV0 indicates a characteristic curve of a level sensing current in the reading operation, a curve MCON0 indicates a characteristic curve of a memory cell current also in the reading operation, and a curve MCON1 indicates a characteristic curve of the memory cell current in the discrimination of a memory cell on current. As is apparent from FIG. 26, the curve MCON1 is positioned below the curve MCON0. Thus, the voltage of the word line signal WL is lowered in the discrimination of a memory cell on current than in the reading operation, thereby also decreasing the memory cell current, so as to discriminate a memory cell on current with margin. This results in higher reliability of the semiconductor device in the reading operation.

(Embodiment 13)

Embodiment 13 will now be described referring to FIG. 27.

In this embodiment, a memory cell on current is discriminated with margin included as in Embodiment 12, and the discrimination (verification) of a memory cell on current is performed at a high temperature. For this purpose, the semiconductor device of this embodiment is provided with a circuit for outputting a signal S1, which is activated at a high temperature and is deactivated at room temperature. This signal S1 is utilized as the control signal S1 described in Embodiment 12 referring to FIG. 25. (A diagram showing the configuration of the output circuit for the signal S1 is herein omitted.)

Figure 27:
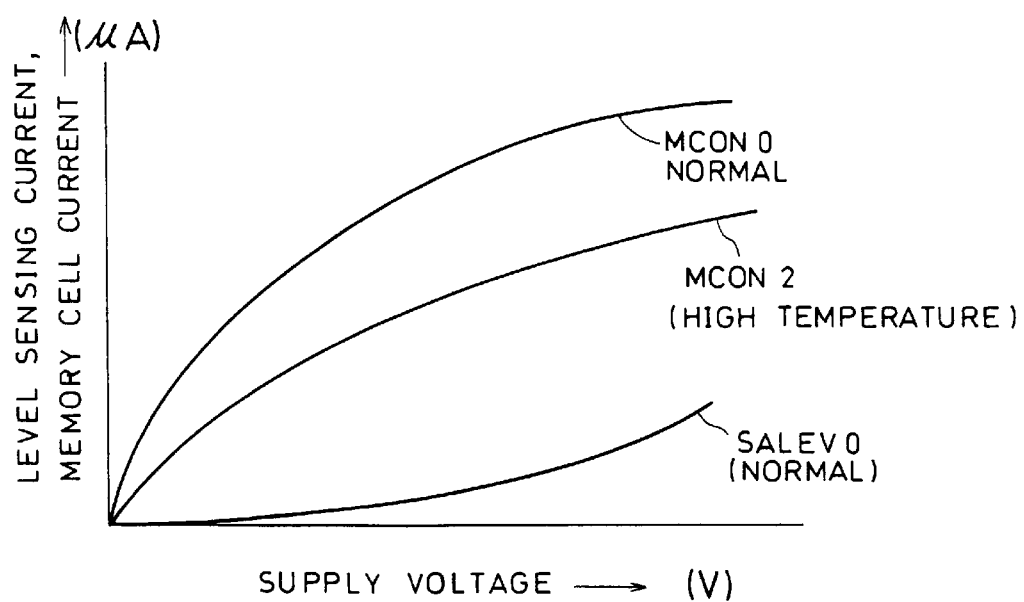
FIG. 27 is a characteristic diagram showing the relationship among a level sensing current, a memory cell current and a supply voltage in a sense amplifier of Embodiment 13.

FIG. 27 is a characteristic diagram showing the relationship among a supply voltage VDD, a memory on current and a level sensing current, wherein a curve SALEV0 indicates a characteristic curve of a level sensing current in the reading operation, a curve MCON0 indicates a characteristic curve of a memory cell current in the reading operation (at room temperature), and a curve MCON2 indicates a characteristic curve of a memory cell current in the discrimination of a memory cell on current (high temperature verification). Similarly to Embodiment 12, the memory cell current in the discrimination of a memory cell on current is decreased as compared with that in the reading operation. Therefore, it is possible to discriminate a memory cell on current with margin included, resulting in improving reliability of the device in the reading operation.

(Embodiment 14)

Embodiment 14 will now be described referring to FIGS. 28 and 29.

Figure 28:
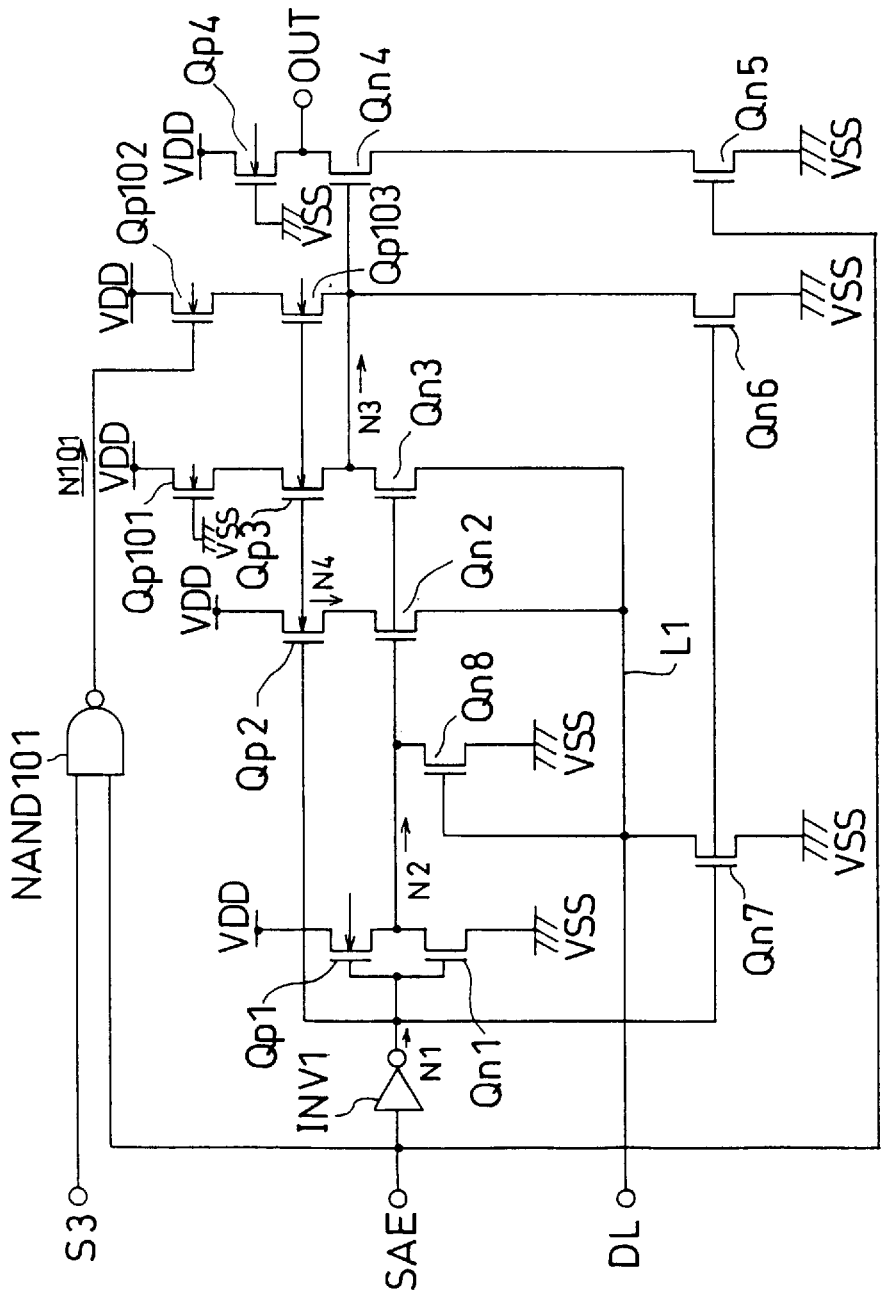
FIG. 28 is an electric circuit diagram of a sense amplifier of Embodiment 14.

FIG. 28 is an electric circuit diagram showing the configuration of a sense amplifier of this embodiment. Also in this embodiment, the configuration and operation of a fundamental portion of the sense amplifier is similar to that of the conventional sense amplifier of FIG. 40.

This sense amplifier is additionally provided with an input terminal for a control signal S3, which is activated in the reading operation and is deactivated in the discrimination (verification) of a memory cell off current. The discrimination herein includes the following two operations one is to confirm that a current flows through a memory cell with the word line for the memory cell selected; and the other is to confirm that no current flows through the memory cell with the word line unselected. This definition of the "discrimination" is applicable to embodiments described hereinafter. The sense amplifier further comprises a NAND circuit NAND101 that receives the control signal S3 and a control signal SAE and outputs a signal N101 generated through the NAND operation of these signals, a P-channel MOS transistor Qp102 that receives the signal N101 at its gate, a P-channel MOS transistor Qp101 that receives a ground potential VSS at its gate, and a P-channel MOS transistor Qp103 that receives, at its gate, an output signal N1 of an inverter INV1 disposed in the fundamental portion. The source of the transistor Qp102 is connected to a terminal for supplying a supply voltage VDD, and the drain thereof is connected to the source of the transistor Qp103. The drain of the transistor Qp103 is connected to a signal line through which a signal N3 flows to be applied to the gate of a transistor Qn4 in an output unit in the fundamental portion. The source of the transistor Qp101 is connected to a terminal for supplying a supply voltage VDD, and the drain thereof is connected to the source of the transistor Qp3.

This sense amplifier is enabled when the control signal SAE is at a high level. When a current flows through a data line (signal line L1), the sense amplifier outputs an output signal OUT at a high level, and when no current flows through the data line (signal line L1), it outputs an output signal OUT at a low level. This operation is similar to that of the conventional sense amplifier. In this sense amplifier, since the control signals SAE and S3 are at a high level in the reading operation, the output signal N101 of the NAND circuit 101 is at a low level, thereby operating the transistor Qp102. As a result, the source potential of the transistor Qp103 is equal to the supply voltage VDD. This increases the potential level of the signal N3. In the discrimination of a memory cell off current, since the control signal S3 is at a low level, the potential Level of the signal N3 is not increased. Thus, the supply voltage dependent characteristic of the level sensing current is switched.

Figure 29:
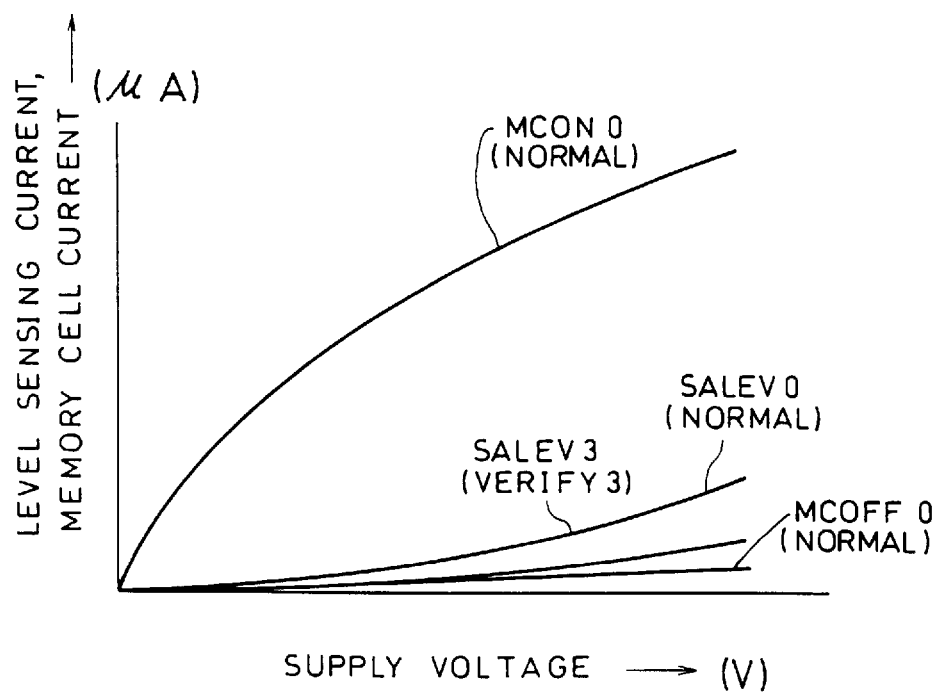
FIG. 29 is a characteristic diagram showing the relationship among a level sensing current, a memory cell current and a supply voltage in the sense amplifier of Embodiment 14.

FIG. 29 illustrates the relationship among a supply voltage VDD, a memory cell current and a level sensing current in the sense amplifier of this embodiment. The level sensing current exhibits a characteristic according to a level sensing current characteristic curve SALEV0 in the reading operation, and exhibits a characteristic according to a level sensing current characteristic curve SALEV3 in the discrimination of a memory cell off current.

An erasing method for a stack type flash memory is disclosed, for example, by Yamada et al., "A self-convergence erasing scheme for single stacked gate FLASH MEMORY" (IEDM Tech. Dig., 1991, p. 301). In this known method, an excessive erasing operation is followed by a reverse operation, thereby approximating a threshold value to 0 V. This can decrease an off leak current in each memory cell.

In this embodiment, a smaller level sensing current is used in the discrimination of a memory cell off current (as shown with the curve SALEV3) than in the reading operation (as shown with the curve SALEV0). Therefore, this semiconductor device can be utilized in the reverse operation following the excessive erasing operation, and it is possible to discriminate a memory cell off current (shown with the curve MCOFF0) in the normal state with margin included.

When such discrimination of a memory cell off current is used together with the discrimination of a memory cell on current described in Embodiment 9, both memory cell on current and memory cell off current can be discriminated with margin included, resulting in largely improving reliability of the semiconductor device.

(Embodiment 15)

Embodiment 15 will now be described referring to FIGS. 30 and 31.

Figure 30:
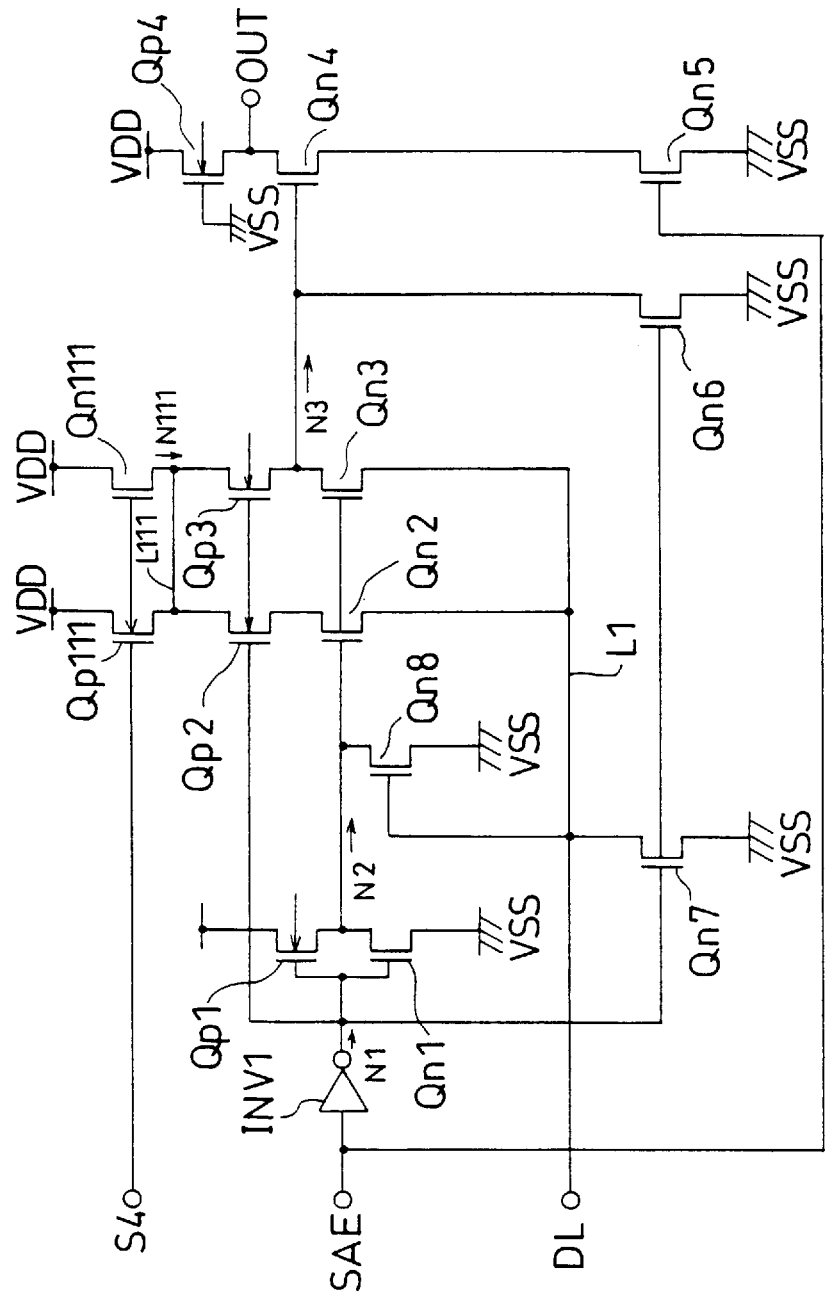
FIG. 30 is an electric circuit diagram of a sense amplifier of Embodiment 15.

FIG. 30 is an electric circuit diagram showing the configuration of a sense amplifier for a semiconductor device of this embodiment. Also in this embodiment, the configuration and operation of a fundamental portion of the sense amplifier is similar to that of the conventional sense amplifier of FIG. 40.

This sense amplifier is additionally provided with an input terminal for a control signal S4, which is activated in the reading operation and is deactivated in the discrimination of a memory cell off current, and a P-channel MOS transistor Qp111 and an N-channel MOS transistor Qn111 that receive the control signal S4 at their gates. The source of the transistor Qp111 is connected to a terminal for supplying a supply voltage VDD, and the drain thereof is connected to the source of a transistor Qp2 disposed in the fundamental portion. The drain of the transistor Qn111 is connected to a terminal for supplying a supply voltage VDD, and the source thereof is connected to the source of a transistor Qp3 disposed in the fundamental portion. A signal line connecting the drain of the transistor Qp111 to the source of the transistor Qp2 is connected to a signal line connecting the source of the transistor Qn111 to the source of the transistor Qp3 via a common signal line L111. When the control signal S4 is at a high level, the transistor Qp111 is off and the transistor Qn111 is on. Therefore, the source potential of the transistors Qp2 and Qp3 is decreased by the threshold value of the transistor Qn111. When the control signal S4 is at a low level, the transistor Qp111 is on and the transistor Qn111 is off. Therefore, the source potential of the transistors Qp2 and Qp3 is equal to the supply voltage VDD. Thus, the source potential of the transistors Qp2 and Qp3 is varied by turning on/off the transistors Qp111 and Qn111. The voltage characteristic of a data line (signal line L1) is changed by utilizing this variation of the source potential. Therefore, this sense amplifier outputs an output signal OUT at a high level when a current flows through the data line (signal line L1), and outputs an output signal OUT at a low level when no current flows through the data line (signal line L1) as in the conventional sense amplifier, but the data line voltage is changed discontinuously in accordance with the logical value of the control signal S4.

Figure 31:
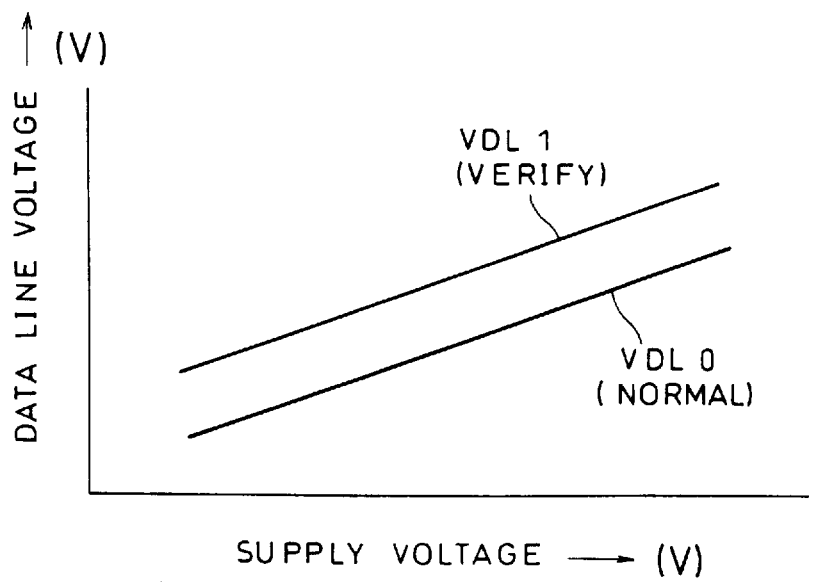
FIG. 31 is a characteristic diagram showing the relationship between a data line voltage and a supply voltage in Embodiment 15.
Figure 32:
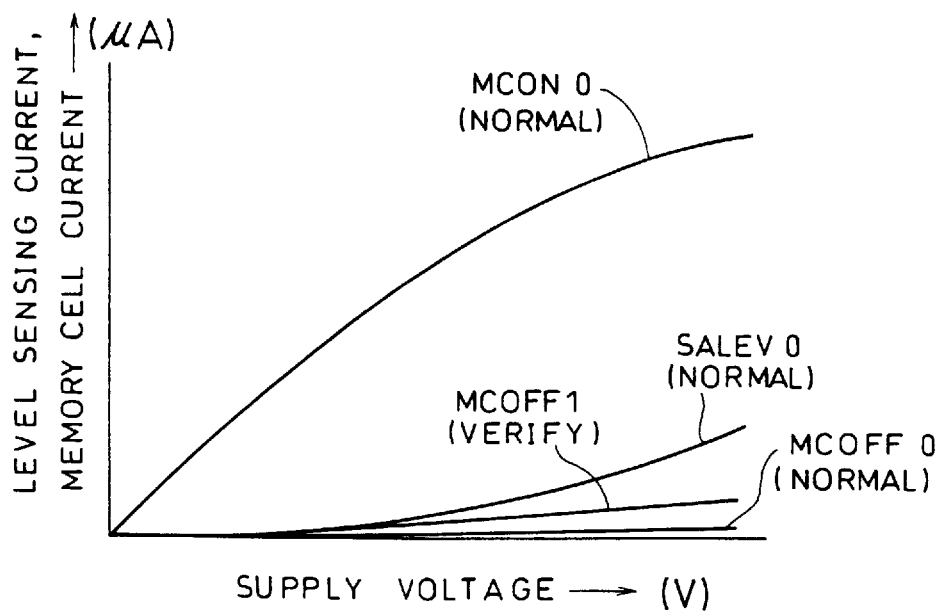
FIG. 32 is a characteristic diagram showing the relationship among a level sensing current, a memory cell current and a supply voltage in a sense amplifier of Embodiment 15.

FIG. 31 illustrates the relationship between a supply voltage VDD and a data line voltage, wherein a characteristic line VDL0 indicates a data line voltage characteristic in the reading operation and a characteristic line VDL1 indicates a data line voltage characteristic in the discrimination of a memory cell off current. FIG. 32 illustrates the relationship among a supply voltage VDD, a memory cell current and a level sensing current, wherein a curve SALEV0 indicates a level sensing current characteristic in the reading operation, a curve MCOFF1 indicates a memory cell off current characteristic in the discrimination of a memory cell off current, a curve MCON0 indicates a memory cell on current characteristic in the reading operation, and a curve MCOFF0 indicates a memory cell off current characteristic in the reading operation.

Since the control signal S4 is at a high level in the reading operation, the data line voltage exhibits a characteristic according to the characteristic line VDL0 of FIG. 31, and the memory cell off current in the reading operation exhibits a characteristic according to the curve MCOFF0 of FIG. 32. In contrast, since the control signal S4 is at a low level in the discrimination of a memory cell off current, the data line voltage exhibits a characteristic according to the characteristic line VDL1 of FIG. 31 obtained by moving the characteristic line VDL0 upward, and the memory cell off current in the discrimination exhibits a characteristic according to the curve MCOFF1 of FIG. 32.

In this embodiment, a higher data line voltage is used in the discrimination of a memory cell off current than in the reading operation, and a larger memory cell off current (shown with the curve MCOFF1) is used in the discrimination than in the reading operation (shown with the curve MCOFF0). This makes easier to detect an off leak current. Additionally, it is possible to discriminate a memory cell off current in the reading operation With margin included, thereby improving reliability of the semiconductor device.

(Embodiment 16)

Embodiment 16 will now be described referring to FIGS. 33 and 34.

Figure 33:
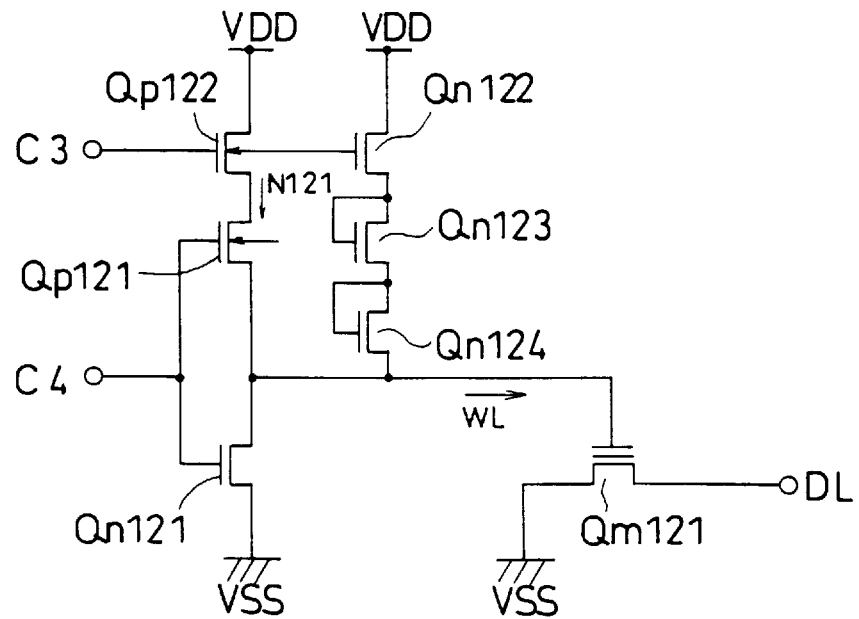
FIG. 33 is an electric circuit diagram of a word line control circuit of Embodiment 16.

FIG. 33 is an electric circuit diagram showing the configuration of a word line control circuit for a semiconductor device of this embodiment. As is shown in FIG. 33, the word line control circuit comprises an input terminal for a control signal C4, which is activated when the semiconductor device is disabled and is deactivated when it is enabled, an input terminal for a control signal C3, which is deactivated in the reading operation and is activated in the discrimination (verification), a CMOS inverter including a P-channel MOS transistor Qp121 and an N-channel MOS transistor Q121 that receive the control signal C4 at their gates, and a P-channel MOS transistor Qp122 and an N-channel MOS transistor Qn122 that receive the control signal C3 at their gates. An output signal line of the CMOS inverter is connected to a word line. The source of the transistor Qp122 is connected to a terminal for supplying a supply voltage VDD, and the drain thereof is connected to the source of the transistor Qp121. The drain of the transistor Qn122 is connected to a terminal for supplying a supply voltage VDD, and the source thereof is connected to the word line via two N-channel MOS transistors Qn123 and Qn124.

The word line is connected to the gate of a memory cell transistor Qm121. The drain of the memory cell transistor Qm121 is connected to a data line and the source thereof is grounded. In other words, an output signal N121 of the transistor Qp122 is applied to the CMOS inverter including the transistor Qp121 and Qn121 serving as an output unit of the word line control circuit, thereby switching the voltage characteristic of a word line signal WL, that is, an output signal of the CMOS inverter, in accordance with the logical value of the signal N121. Specifically since the control signal C3 is at a low level and the control signal C4 is at a high level when the semiconductor device is disabled, the voltage of the word line signal WL is equal to a ground voltage VSS. Since both the control signals C3 and C4 are at a low level in the reading operation, the voltage of the word line signal WL is equal to the supply voltage VDD. Since the control signal C3 is at a high level and the control signal C4 is at a low level in the discrimination of a memorcell off current, the voltage of the word line signal WL is lower than the supply voltage VDD by the total threshold voltages of the three transistors Qn122 through Qn124. The voltage of the word line signal WL in the last case is slightly higher than the ground voltage VSS.

Figure 34:
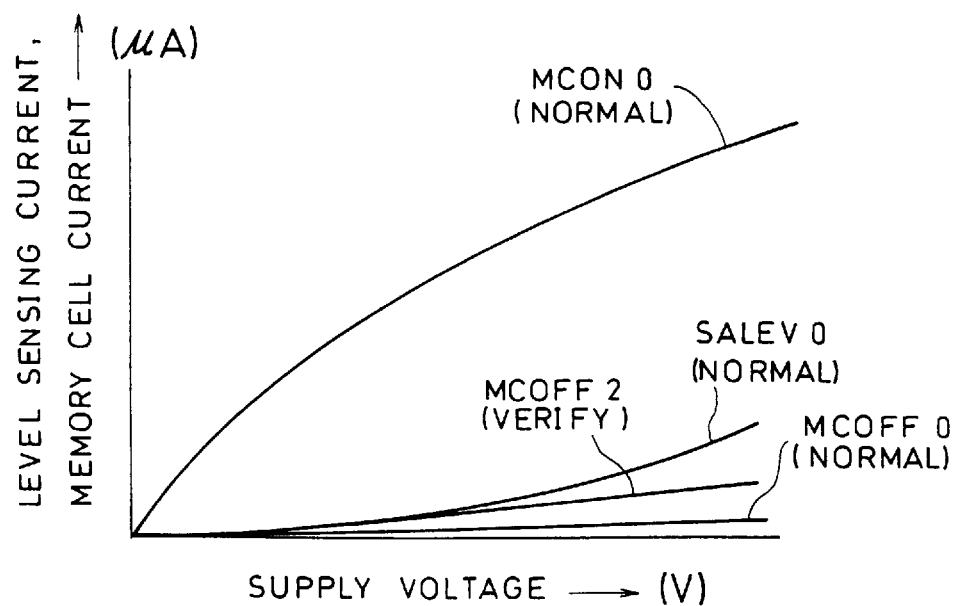
FIG. 34 is a characteristic diagram showing the relationship among a level sensing current, a memory cell current and a supply voltage in a sense amplifier of Embodiment 16.

FIG. 34 illustrates the relationship among a supply voltage VDD, a level sensing current and a memory cell off current in the semiconductor device including this word line control circuit. A curve SALEV0 indicates a level sensing current characteristic in the reading operation, a curve MCON0 indicates a memory cell current characteristic in the reading operation, a curve MCOFF0 indicates a memory cell off current characteristic in the normal reading operation, and a curve MCOFF1 indicates a memory cell current characteristic in the discrimination of a memory cell off current. Thus, the voltage of the word line signal WL is slightly higher than the ground voltage VSS in the discrimination of a memory cell off current as compared with the case where the device is disabled, and a larger memory cell off current is used in the discrimination (shown as the curve MCOFF2) than in the reading operation (shown as the curve MCOFF0). Thus, a memory cell off current is discriminated with margin included. As a result, detection of an off leak current becomes easier, and reading reliability in the reading operation is improved.

This technique is applicable not only to the discrimination of a memory cell off current with margin included but also to the setting of a threshold value in a flash EEPROM that stores a data by varying the threshold voltage of a memory cell transistor. so that a current is allowed to flow therethrough when the gate voltage of the memory cell transistor is equal to the supply voltage and a current is not allowed to flow when the gate voltage is equal to the ground voltage. In this case. this technique is advantageous because it is possible to set a threshold value with margin included by increasing the gate voltage to be slightly higher than the ground voltage and also because the setting of the threshold value requires a shorter time.

When a memory cell off current is to be discriminated with margin included as in this embodiment, it is possible to perform the discrimination of the memory cell off current at a high temperature as in Embodiment 13, which is not described herein as a separate embodiment. Also in such a case, a memory cell off current in the discrimination (with the characteristics according to the curve MCOFF2 of FIG. 34) is higher than a memory cell off current in the reading operation (with the characteristic according to the curve MCOFF0 of FIG. 34). Therefore, it is possible to discriminate the memory cell off current with margin included and to improve reliability in the reading operation.

(Embodiment 17)

Embodiment 17 will now be described referring to FIGS. 35 and 36.

In this embodiment, a current value of a current flowing through a memory cell is detected by a current detecting type sense amplifier having a plurality of level sensing currents, thereby discriminating a plurality of data values (multivalues) using the current value in one memory cell. The sense amplifier of this embodiment has three level sensing currents, and writes and reads data of four values, i.e., two bits, using one memory cell. FIG. 35 shows the configuration of an exemplified current detecting type sense amplifier having a plurality of level sensing currents, and FIG. 36 is a time chart showing the multivalue reading system by the sense amplifier of FIG. 35.

Figure 35:
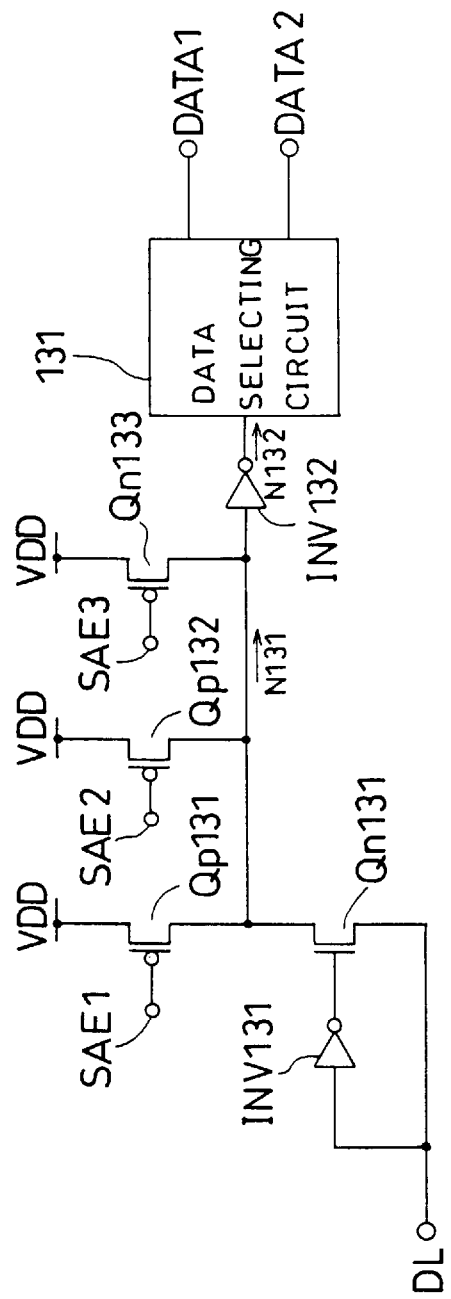
FIG. 35 is an electric circuit diagram of a sense amplifier having a plurality of level sensing currents of Embodiment 17.
Figure 36:
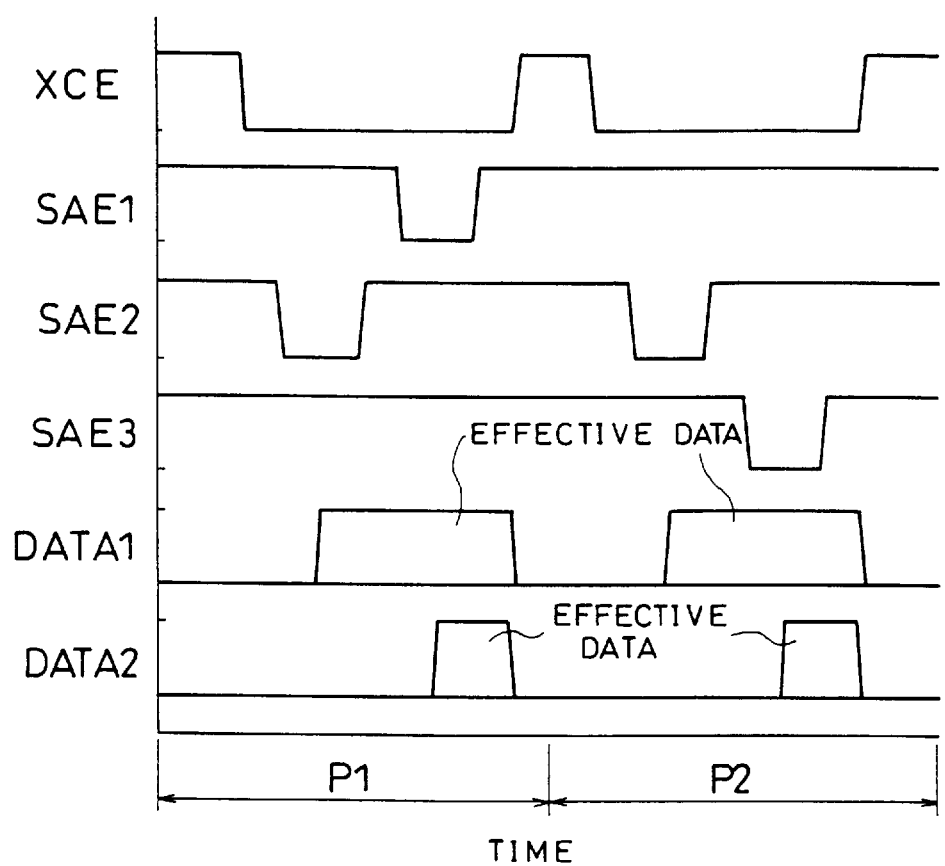
FIG. 36 is a time chart illustrating a data reading system in Embodiment 17.

As is shown in FIG. 35, the sense amplifier of this embodiment comprises an inverter INV131 that receives a data line signal DL and outputs an inverted signal thereof, an N-channel MOS transistor Qn131 that receives the output signal of the inverter INV131 at its gate, three P-channel MOS transistors Qp131, Qp132 and Qp133 that receive control signals SAE1, SAE2 and SAE 3 at their gates, respectively, an inverter INV132 that is connected to a signal line through which a signal N131 flows from the drain of the transistor Qn131 and outputs a signal N132 generated by inverting the signal N131, and a data selecting circuit 131 that selects data in response to the output signal N132 of the inverter INV132 so as to output data signals DATA1 and DATA2. The drains of the transistors Qp131 through Qp133 are respectively connected to terminals for supplying a supply voltage, and the sources thereof are connected to the signal line through which the signal N131 flows from the drain of the transistor Qn131. In other words, the transistors Qp131 through Qp133 are connected in parallel to one another between the terminals for supplying the supply voltage and the signal line through which the signal N131 flows from the drain of the transistor Qn131.

The operation of this sense amplifier will now be described referring to the time chart of FIG. 36, wherein a signal XCE is an activating signal for the sense amplifier, and each of periods P1 and P2 corresponds to one cycle of a clock signal. The sense amplifier is operated in the respective periods P1 and P2 as follows.

First, the signal XCE undergoes a high to low transition. Then, a sense amplifier control signal SAE2 undergoes a high to low transition, and a memory cell current is discriminated using a level sensing current controlled by the transistor Qp132. The result of the discrimination is output as a discrimination data signal DATA1.

When the discrimination data signal DATA1 is at a high level, a sense amplifier control signal SAE1 undergoes a high to low transition, and a memory cell current is discriminated using another level sensing current controlled by the transistor Qp131. The result of the discrimination is output as a discrimination data signal DATA2. When the discrimination data signal DATA1 is at a low level, a sense amplifier control signal SAE3 undergoes a high to low transition, and a memory cell current is discriminated using still another level sensing current controlled by the transistor Qp133. The result of the discrimination is output as a discrimination data signal DATA2. These discrimination data signals correspond to effective data shown in FIG. 36.

In this manner, a discrimination data signal DATA1 is first defined and then a discrimination data signal DATA2 is defined. Thus, two bits of data are read.

According to this embodiment, multivalued data can be read without using a particular reference memory cell. Furthermore, a so-called binary search is performed, in which a memory cell current is first discriminated using an intermediate level sensing current and then a subsequent level sensing current is determined based on the data obtained through the first discrimination. Thus, it is possible to read two bits of data through two discrimination operations. Although four values, two bits of data are exemplified in this embodiment, the binary search can be similarly performed with regard to a larger number of values.

(Embodiment 18)

Embodiment 18 will now be described referring to FIGS. 37 and 38.

In this embodiment, similarly to Embodiment 17, a current value of a current flowing through a memory cell is discriminated by using a current detecting type sense amplifier having a plurality of level sensing currents, thereby discriminating a plurality of data values using the current value in one memory cell. In particular, the current detecting type sense amplifier of this embodiment can substantially simultaneously discriminate a memory cell current using a plurality of level sensing currents. The sense amplifier of this embodiment has three level sensing currents, and writes and reads four values, i.e., two bits of data using one memory cell.

Figure 37:
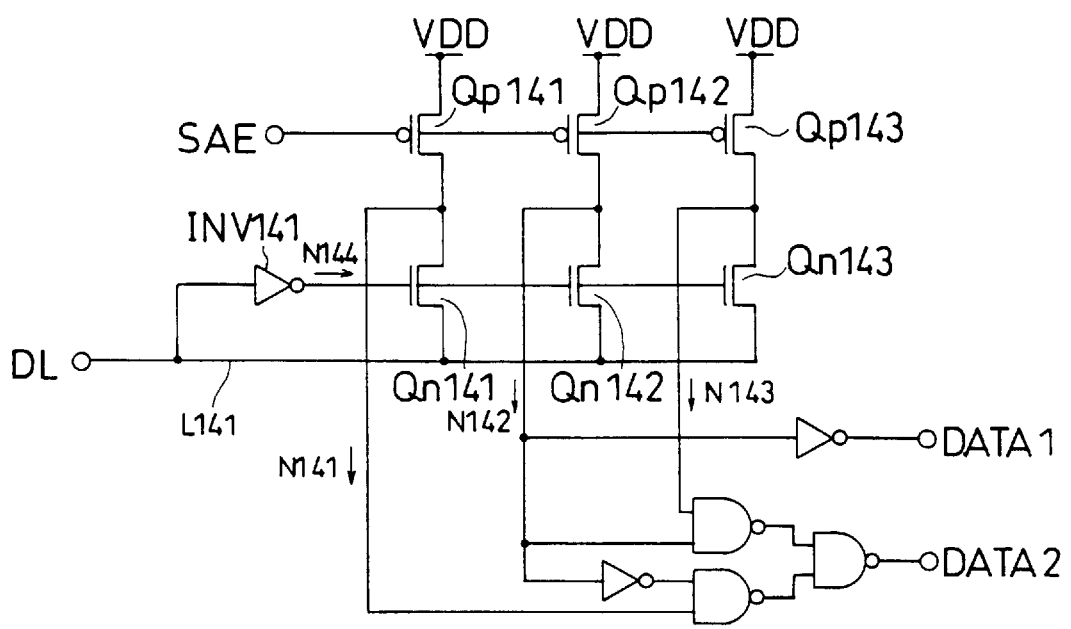
FIG. 37 is an electric circuit diagram of a sense amplifier having a plurality of level sensing currents and a multivalued data discriminating function of Embodiment 18.
Figure 38:
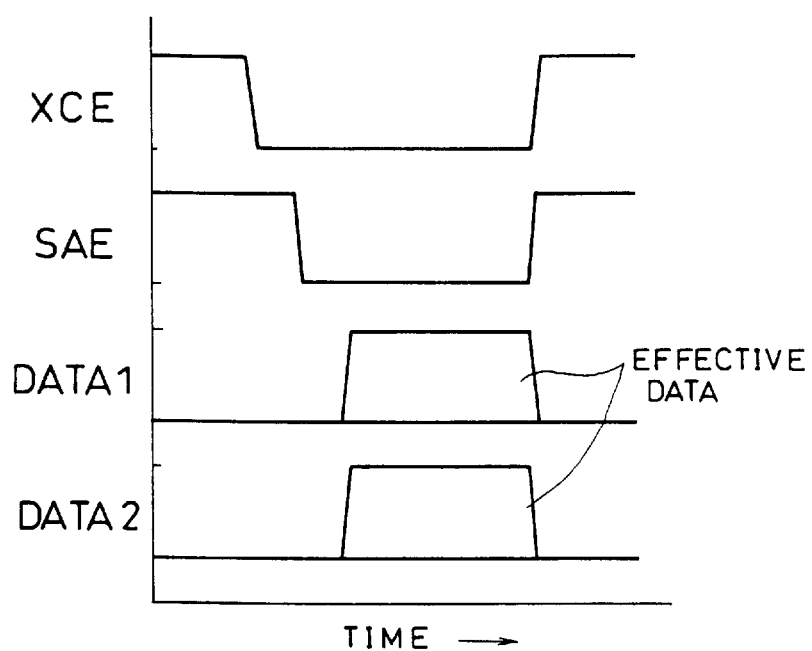
FIG. 38 is a time chart illustrating the operation of the sense amplifier of Embodiment 18.

FIG. 37 is an electric circuit diagram of the current detecting type sense amplifier of this embodiment having a plurality of level sensing currents and discriminating multivalued data simultaneously. FIG. 38 is a time chart for showing the multivalue reading system by the sense amplifier of FIG. 37.

As is shown in FIG. 37, the sense amplifier comprises, in the former stage, an inverter INV141 that receives a data line signal DL and outputs a signal N144 generated by inverting the data line signal DL, three P-channel MOS transistors Qp141, Qp142 and Qp143 that receive a control signal SAE at their gates, and three N-channel MOS transistors Qn141, Qn142 and Qn143 that receive the output signal N144 of the inverter INV141 at their gates. The sources of the transistors Qp141, Qp142 and Qp143 are respectively connected to terminals for supplying a supply voltage VDD, and the drains thereof are connected to the drains of the transistors Qn141, Qn142 and Qn143, respectively. The sources of the transistors Qn141, Qn142 and Qn143 are commonly connected to a data line (signal line L141). In other words, three groups each including a P-channel MOS transistor and an N-channel transistor connected in series are connected in parallel between the terminals for supplying the supply voltage and the data line. A signal N142 is transferred through a signal line commonly connected to the drains of the transistors Qp142 and Qn142, then is inverted by an inverter, and the inverted signal is output as a data signal DATA1. Three signals N141 through N143 transferred through signal lines connecting the drains of the transistors Qp141, Qp142 and Qp143 to the drains of the transistors Qn141, Qn142 and Qn143, respectively, are allowed to pass through one inverter and three NAND circuits, and the resultant signal obtained through the operation of these circuits is output as a data signal DATA2.

The operation of the sense amplifier will now be described referring to the time chart of FIG. 38, wherein a signal XCE is an actuating signal for the sense amplifier. The signal XCE undergoes a high to low transition, and then the control signal SAE undergoes a high to low transition, thereby substantially simultaneously outputting three discrimination signals N141 through N143 obtained using the level sensing currents controlled by the transistors Qp141 through Qp143, respectively. Among the transistors Qn141 through Qn143, the transistor Qn141 has the largest threshold value and the transistor Qn143 has the smallest threshold value. In this manner, the data signals DATA1 and DATA2 are output from a static logical circuit receiving the signals N141 through N143 as input signals. These discrimination data signals correspond to effective data shown in FIG. 38.

According to this embodiment, multivalued data can be read without using a particular reference memory cell as in Embodiment 17. Moreover, although the data signals DATA1 and DATA2 are defined through two steps in Embodiment 17, the sense amplifier of this embodiment is more advantageous because the data signals DATA1 and DATA2 are defined in one step alone, resulting in rapid data reading.

(Embodiment 19)

Embodiment 19 will now be described referring to FIG. 39.

In this embodiment, the characteristic of a level sensing current is switched combinationally with the boosting of a memory cell transistor in accordance with the logical value of a voltage detecting signal as in Embodiment 8. This embodiment relates to the discrimination operation such as verification of operational margin for a semiconductor device.

Figure 39:
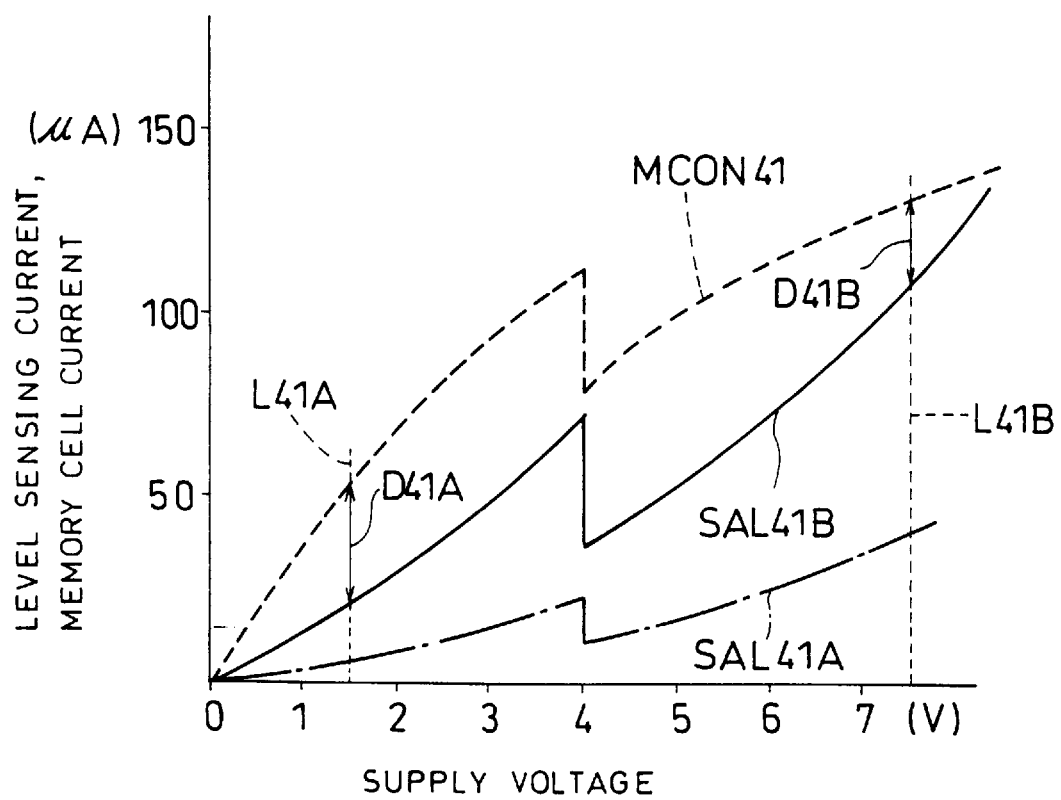
FIG. 39 is a characteristic diagram showing the relationship among a level sensing current, a memory cell current and a supply voltage in a sense amplifier of Embodiment 19.

FIG. 39 shows the relationship among a supply voltage VDD, a memory cell current and a level sensing current in a sense amplifier of this embodiment. In FIG. 39, a curve MCON41 indicates a characteristic curve of a memory cell current, a curve SAL41A indicates a characteristic curve of a level sensing current in the reading operation, and a curve SAL41B indicates a characteristic curve of a level sensing current used in a reading operation under a strict condition, for example, performed in a test before shipping the semiconductor device.

As described in Embodiment 8, both the level sensing currents SAL41A and SAL41B are varied discontinuously at the supply voltage VDD of 4 V so as to be higher in the low voltage region, and these curves have a shape swelling downward in each voltage region. The memory cell current shown with the curve MCON41 is also varied discontinuously at the supply voltage VDD of 4 V so as to be higher in the low voltage region, and has a shape swelling upward in each voltage region. Since the characteristic curves of the level sensing current and the memory cell current have such shapes swelling in the different directions, a distance between the level sensing current and the memory cell current is smaller in some portions. Such portions are, for example, in the low voltage region, a distance D41A between the curves SAL41B and MCON41 on a line L41A corresponding to the supply voltage of 1.5 V, and in the high voltage region, a distance D41B between the curves SAL41B and MCON41 on a line L41B corresponding to the supply voltage of 7.5 V. Specifically, in order to obtain a semiconductor device with sufficient operational margin and high reliability, it is significant to perform discrimination in consideration of the operational margin at the supply voltages VDD of 1.5 V and 7.5 V. Therefore, in the sense amplifier of this embodiment, the discrimination is performed under application of the supply voltages of 1.5 V and 7.5 V.

When the difference between the level sensing current and the memory cell current is minimized at a point corresponding to the supply voltage of 4 V, where the operation characteristic is discontinued, it may be required to perform the discrimination at that voltage.

Although the level sensing current SAL41B for the strict reading operation used, for example, before the shipment of the device is described in this embodiment, it is possible to adopt another level sensing current for the use of another reading operation.

We claim:

1. The semiconductor device comprising:

a memory cell;

a data line connected to the memory cell;

a first group of a plurality of transistors whose sources are connected to the data line, the first group including at least a first and second transistors; and a second group of a plurality of transistors which are disposed between a power supply and the drains of the first group of the transistors, and each of which is supplied with a first signal at gate thereof, the second group including at least a third and fourth transistors, wherein the first transistor has a different current ability or a different threshold value from that of the second transistor, and a plurality of data values are discriminated with a current value in one memory cell by using a signal from the drain of the first transistor and a signal from the drain of the second transistor.

* * * * *